United States Patent
Qiao et al.

(10) Patent No.: US 12,027,577 B2
(45) Date of Patent: Jul. 2, 2024

(54) LATERAL POWER SEMICONDUCTOR DEVICE

(71) Applicant: University of Electronic Science and Technology of China, Chengdu (CN)

(72) Inventors: Ming Qiao, Chengdu (CN); Shuhao Zhang, Chengdu (CN); Zhangyi'an Yuan, Chengdu (CN); Dican Hou, Chengdu (CN); Bo Zhang, Chengdu (CN)

(73) Assignee: University of Electronic Science and Technology of China, Chengdu (CN)

( * ) Notice: Subject to any disclaimer, the term of this patent is extended or adjusted under 35 U.S.C. 154(b) by 607 days.

(21) Appl. No.: 17/351,267

(22) Filed: Jun. 18, 2021

(65) Prior Publication Data

US 2022/0352304 A1 Nov. 3, 2022

(30) Foreign Application Priority Data

Apr. 29, 2021 (CN) ............................ 202110476270.

(51) Int. Cl.
*H01L 29/06* (2006.01)
*H01L 29/08* (2006.01)
*H01L 29/66* (2006.01)
*H01L 29/78* (2006.01)

(52) U.S. Cl.
CPC ........ *H01L 29/063* (2013.01); *H01L 29/0878* (2013.01); *H01L 29/66681* (2013.01); *H01L 29/7816* (2013.01)

(58) Field of Classification Search
CPC ............... H01L 29/063; H01L 29/0878; H01L 29/66681; H01L 29/7816; H01L 29/0634; H01L 29/1095; H01L 29/0696; H01L 29/407; H01L 29/4236; H01L 29/42368; H01L 29/4238; H01L 29/7825
See application file for complete search history.

(56) References Cited

U.S. PATENT DOCUMENTS

| | | | | |
|---|---|---|---|---|
| 9,620,638 B1* | 4/2017 | Luo | ...................... | H01L 29/7816 |
| 2011/0278650 A1* | 11/2011 | Tamaki | ............... | H01L 29/7802 |
| | | | | 257/288 |
| 2014/0197487 A1* | 7/2014 | Cascino | ................ | H01L 29/407 |
| | | | | 438/286 |
| 2014/0264586 A1* | 9/2014 | Moon | ................. | H01L 29/7818 |
| | | | | 438/237 |

(Continued)

*Primary Examiner* — S M Sohel Imtiaz
(74) *Attorney, Agent, or Firm* — Bayramoglu Law Offices LLC

(57) ABSTRACT

A lateral power semiconductor device includes a first type doping substrate at a bottom of the lateral power semiconductor device, a second type doping drift region, a second type heavy doping drain, a first type doping body; a first type heavy doping body contact and a second type heavy doping source, where dielectric layers are on a right side of the second type heavy doping source; the dielectric layers are arranged at intervals in a longitudinal direction in the first type doping body, and between adjacent dielectric layers in the longitudinal direction is the first type doping body; and a polysilicon is surrounded by the dielectric layer at least on a right side. Compared with conventional trench devices, the lateral power semiconductor device introduces a lateral channel, to increase a current density, thereby realizing a smaller channel on-resistance.

18 Claims, 24 Drawing Sheets

(56) References Cited

U.S. PATENT DOCUMENTS

| | | | |
|---|---|---|---|
| 2015/0243783 A1* | 8/2015 | Lee | H01L 29/086 438/286 |
| 2020/0020775 A1* | 1/2020 | Ni | H01L 21/0465 |
| 2021/0143148 A1* | 5/2021 | Jonishi | H01L 23/49562 |

* cited by examiner

LATERAL POWER SEMICONDUCTOR DEVICE

CROSS REFERENCE TO THE RELATED APPLICATIONS

This application is based upon and claims priority to Chinese Patent Application No. 202110476270.X filed on Apr. 29, 2021, the entire contents of which are incorporated herein by reference.

TECHNICAL FIELD

The present invention belongs to the field of semiconductor technologies, and specifically, relates to a lateral power semiconductor device.

BACKGROUND

For semiconductor devices used in the medium and low voltage fields, on-resistance and current density are important indicators to measure a device. For a semiconductor device with the voltage specification, a channel resistance and a drift region resistance are main components of the on-resistance. Effectively reducing the channel resistance and the drift zone resistance has become an important way to improve an optimal value of the device. The present invention aims to improve a channel density of the device and increase current paths through polysilicon trenches distributed at intervals, so that the device has a high-density current distribution in lateral and longitudinal directions of a channel region. Based on reducing the on-resistance, the present invention further reduces a gate-to-drain capacitance through ways of shielding gate, thick gate oxide, and the like to optimize frequency characteristics of the device. In addition, the REduced SURface Field (RESURF) technology is adopted to further reduce the on-resistance of the drift region. Therefore, the optimal value of the device is improved through the manners mentioned above.

SUMMARY

The present invention puts forward a lateral power semiconductor device structure, which has a high current density that could reduce an on-resistance, and a series of methods are used to further reduce a gate-to-drain capacitance and a drift zone resistance of the device, to obtain a better optimal value of the device.

To achieve aims of the present invention mentioned above, the technical solutions of the present invention are as follows:

A lateral power semiconductor device, including: a first type doping substrate 8 at the bottom of the device, a second type doping drift region 5 above the first type doping substrate 8, a second type heavy doping drain 6 located at the upper right of the second type doping drift region 5, and a first type doping body 4 located at the upper left in the second type doping drift region 5; where a first type heavy doping body contact 1 and a second type heavy doping source 2 are provided at the upper left in the first type doping body 4, and dielectric layers 7 are on the right side of the second type heavy doping source 2;

a lateral direction refers to a direction from the first type heavy doping body contact 1 to the second type heavy doping drain 6 in a plane parallel to the surface of the device, a longitudinal direction refers to a direction perpendicular to the lateral direction in the plane, and a vertical direction refers to a direction perpendicular to the plane; and the dielectric layers 7 are arranged at intervals in the longitudinal direction in the first type doping body 4, and between adjacent dielectric layers 7 in the longitudinal direction is the first type doping body 4; and a polysilicon 3 is partially or completely surrounded by the dielectric layer 7.

As a preferred manner, the right boundary of the first type heavy doping body contact 1 is tangent to the left boundary of the second type heavy doping source 2, and the right boundary of the second type heavy doping source 2 is tangent to the left boundary of the dielectric layer 7; or left sides of the dielectric layers 7 extend to the left into the second type heavy doping source 2; and the left side of the first type heavy doping body contact 1 is tangent to the right side of the second type heavy doping source 2; and the first type heavy doping body contact 1 does not contact adjacent dielectric layers 7 in the longitudinal direction.

As a preferred manner, the right boundary of the polysilicon 3 is on the left side of the right boundary of the first type doping body 4; or the right boundary of the polysilicon 3 is aligned with the right boundary of the first type doping body 4; or the right boundary of the polysilicon 3 is on the right side of the right boundary of the first type doping body 4.

As a preferred manner, the upper boundary of the polysilicon 3 is tangent to the upper boundary of the dielectric layer 7, or the upper boundary of the polysilicon 3 is separated from the upper boundary of the dielectric layer 7 by a certain distance.

As a preferred manner, the bottom of the polysilicon 3 is aligned with the bottom of the first type doping body 4; or the bottom of the polysilicon 3 is located above the bottom of the first type doping body 4; or the bottom of the polysilicon 3 is located below the bottom of the first type doping body 4.

As a preferred manner, a distance between the right boundary of the polysilicon 3 and the right boundary of the dielectric layer 7 is a, a distance between the bottom of the polysilicon 3 and the bottom of the dielectric layer 7 is b, a>b, or a<b, or a=b, and both a and b are greater than a distance between the left boundary of the polysilicon 3 and the left boundary of the dielectric layer 7.

As a preferred manner, the right boundary of the polysilicon 3 is an arc concave to the left.

As a preferred manner, a field oxide layer 9 is located on part of the upper surface of a second type doping drift region 5, the left side of the field oxide layer 9 contacts the dielectric layer 7, the right side of the field oxide layer 9 contacts the second type heavy doping drain 6, and the field oxide layer 9 extends downward into the second type doping drift region 5.

As a preferred manner, polysilicon 3 in each dielectric layer 7 are divided into two parts: first polysilicon 31 and second polysilicon 32 in the longitudinal, lateral, or vertical direction; or the polysilicon 3 is U-shaped opening to the right; or
the polysilicon 3 is a hollow square.

As a preferred manner, the polysilicon 3 in each dielectric layer 7 are divided into two parts in the lateral direction: the first polysilicon 31 on the left side and the second polysilicon 32 on the right side; or the polysilicon 3 in each dielectric layer 7 are divided into two parts in the longitudinal direction: the first polysilicon 31 on the upper part and the second polysilicon 32 on the lower part; or the polysilicon 3 in each dielectric layer 7 are divided into two parts in the vertical direction: the first polysilicon 31 on the upper part and the second polysilicon 32 on the lower part; where a distance between the right side of the second polysilicon 32 and the right side of the dielectric layer 7 is c, a distance between the bottom of the second polysilicon 32 and the bottom of the dielectric layer 7 is d, a distance between the left side of the first polysilicon 31 and the left side of the dielectric layer 7 is e, and a relationship between the three distances is as follows:

$c>d$ and $d=e$; or $c<d$ and $c=e$; or $c>e$ and $d>e$.

As a preferred manner, the first polysilicon 31 is of an inverted "L" shape and the second polysilicon 32 is of a rectangular shape, and the second polysilicon 32 is located below the right side of the first polysilicon 31; or the first polysilicon 31 is of a rectangular shape and the second polysilicon 32 is of an "L" shape, and the first polysilicon 31 is located at the upper left of the second polysilicon 32; or the first polysilicon 31 is of an inverted "L" shape and the second polysilicon 32 is of an "L" shape.

As a preferred manner, metals 14 are respectively located on the left side of the second type heavy doping source 2 and the right side of the second type heavy doping drain 6; the first type heavy doping body contact 1 is located below the left part of the second type heavy doping source 2, and left sides of both the first type heavy doping body contact 1 and the second type heavy doping source 2 contact the metal 14; the bottom of the metal 14 is below the bottom of the first type heavy doping body contact 1; the right side of the second type heavy doping drain 6 contacts the metal 14; and the bottom of the metal 14 is below the bottom of the second type heavy doping drain 6.

As a preferred manner, a first type doping surface layer region 27 is partially located over the second type doping drift region 5, and the upper surface of the first type doping surface layer region 27 is tangent to the upper surface of the second type doping drift region 5 or the upper surface of the first type doping surface layer region 27 does not contact the upper surface of the second type doping drift region 5; the left boundary of the first type doping surface layer region 27 does not contact the right boundary of the dielectric layer 7; and the right boundary of the first type doping surface layer region 27 does not contact the left boundary of the second type heavy doping drain 6.

The beneficial effects of the present invention are: compared with conventional trench devices, the present invention introduces a lateral channel, increases a current density, and realizes a smaller channel on-resistance. On this basis, some embodiments of the present invention further reduce a gate-to-drain capacitance, achieve better frequency characteristics, and further reduce a drift region on-resistance by using RESURF technologies.

1 is a first type heavy doping body contact, 2 is a second type heavy doping source, 3 is a polysilicon, 31 is a first polysilicon, 32 is a second polysilicon, 4 is a first type doping body, 5 is a second type doping drift region, 6 is a second type heavy doping drain, 7 is a dielectric layer, 8 is a first type doping substrate, 9 is a field oxide layer, 14 is a mental, and 27 is a first type doping surface layer region.

DETAILED DESCRIPTION OF THE EMBODIMENTS

The following describes the implementations of the present invention through specific examples, and a person skilled in the art may easily understand other advantages and effects of the present invention from the content disclosed in this specification. The present invention may also be implemented or applied through other different specific implementations, and various details in this specification may also be modified or changed based on different viewpoints and applications without departing from the spirit of the present invention.

A first type is P type and a second type is N type, or the first type is N type and the second type is P type.

A heavy doping refers to a doping with a concentration greater than $1E19$ $cm^{-3}$.

Embodiment 1

Figure 1A:
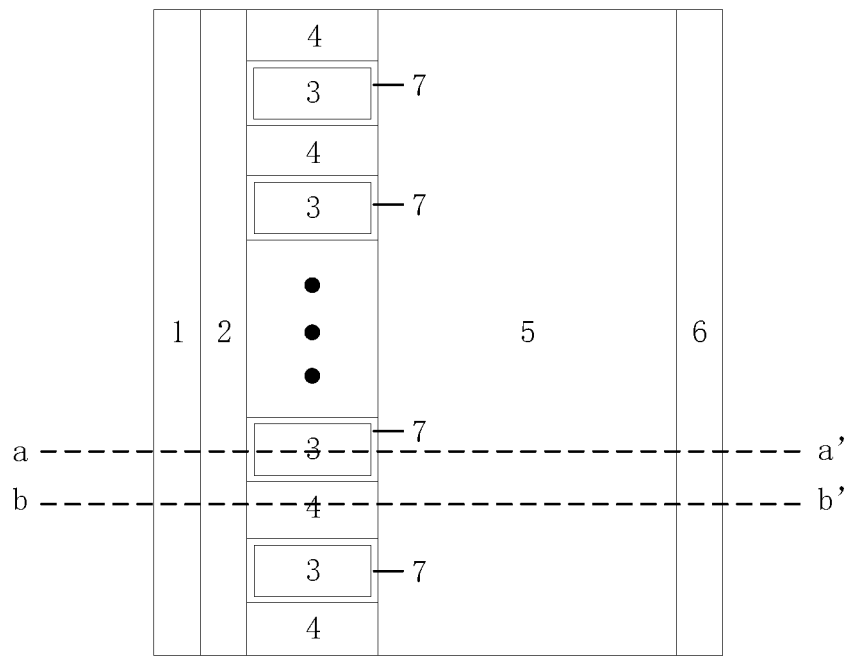
FIG. 1A is a top view of Embodiment 1 according to the present invention.
Figure 1B:
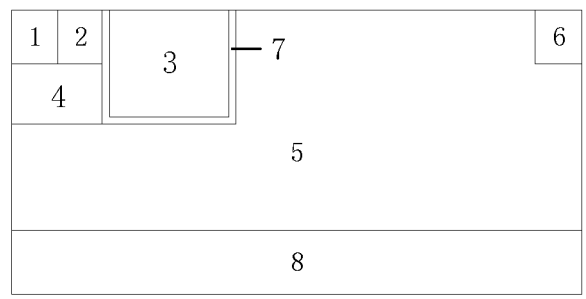
FIG. 1B is a cross section view along an aa' direction of Embodiment 1 according to the present invention.
Figure 1C:
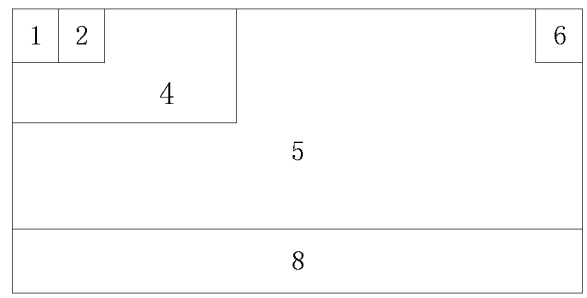
FIG. 1C is a cross section view along a bb' direction of Embodiment 1 according to the present invention.

As shown in FIG. 1A, FIG. 1B, and FIG. 1C, a lateral power semiconductor device, including a first type doping substrate 8 at the bottom of the device, a second type doping drift region 5 above the first type doping substrate, a second type heavy doping drain 6 located at the upper right of the second type doping drift region 5, and a first type doping body 4 located at the upper left in the second type doping drift region 5; where a first type heavy doping body contact 1 and a second type heavy doping source 2 are provided at the upper left in the first type doping body 4, and dielectric layers 7 are on the right side of the second type heavy doping source 2;

a lateral direction refers to a direction from the first type heavy doping body contact 1 to the second type heavy doping drain 6 in a plane parallel to the surface of the device, a longitudinal direction refers to a direction perpendicular to the lateral direction in the plane, and a vertical direction refers to a direction perpendicular to the plane; and the dielectric layers 7 are arranged at intervals in the longitudinal direction in the first type doping body 4, and between adjacent dielectric layers 7 in the longitudinal direction is the first type doping body 4; a polysilicon 3 is provided inside the dielectric layer 7, and the bottom and left and right sides of the polysilicon 3 are surrounded by the dielectric layer 7.

The right boundary of the first type heavy doping body contact 1 is tangent to the left boundary of the second type heavy doping source 2, and the right boundary of the second type heavy doping source 2 is tangent to the left boundary of the dielectric layer 7.

As shown in FIG. 1A, the right boundary of the dielectric layer 7 is aligned with the right boundary of the first type doping body 4; and as shown in FIG. 1B, the upper boundary of a first type polysilicon 3 is tangent to the upper boundary of the dielectric layer 7. The bottom of the first type doping body 4 is located below the bottom of the first type polysilicon 3.

Embodiment 2

Figure 2A:
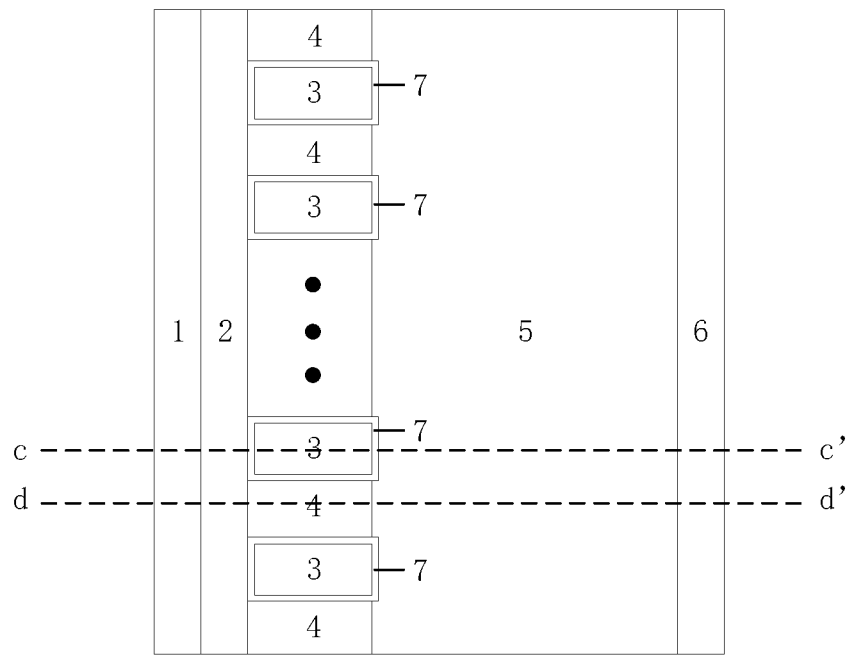
FIG. 2A is a top view of Embodiment 2 according to the present invention.
Figure 2B:
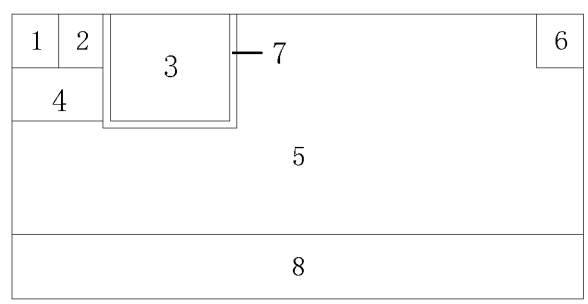
FIG. 2B is a cross section view along a cc' direction of Embodiment 2 according to the present invention.
Figure 2C:
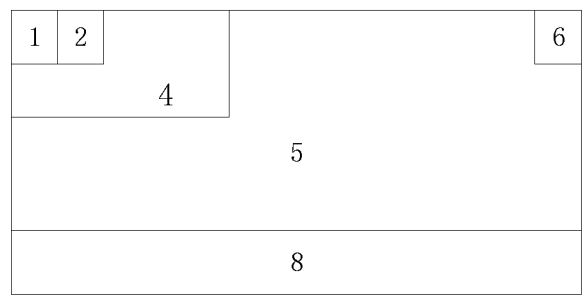
FIG. 2C is a cross section view along a dd' direction of Embodiment 2 according to the present invention.

As shown in FIG. 2A, FIG. 2B, and FIG. 2C, the difference between this embodiment and Embodiment 1 is: right boundaries of the dielectric layers 7 extend into the second type doping drift region 5 in the longitudinal direction, the right boundary of the first type polysilicon 3 is aligned with the right boundary of the first type doping body 4 in the longitudinal direction; and the bottom of the first type doping body 4 is on the same line as the bottom of the first type polysilicon 3.

Embodiment 3

Figure 3A:
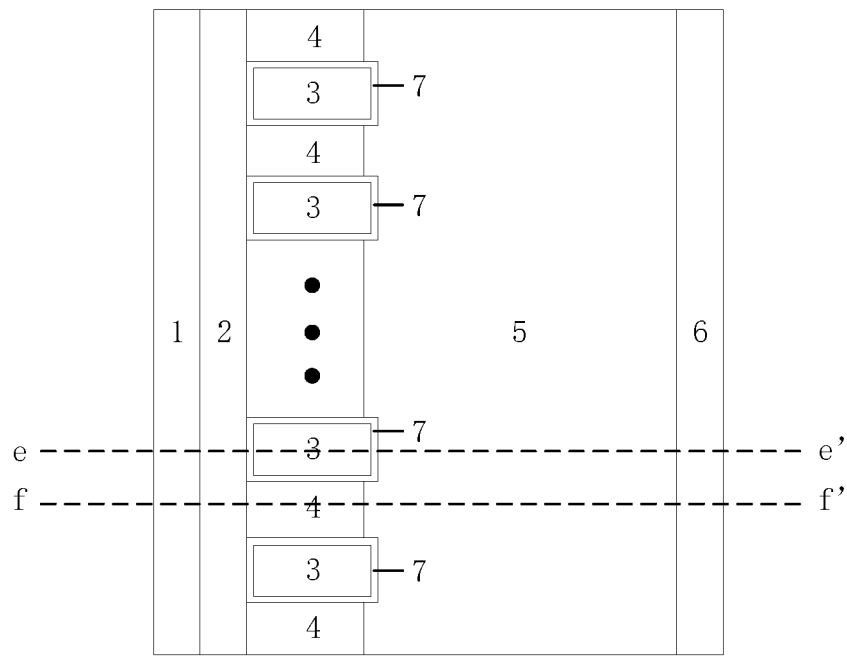
FIG. 3A is a top view of Embodiment 3 according to the present invention, and the embodiment changes relative lengths of a channel region and a polysilicon gate.
Figure 3B:
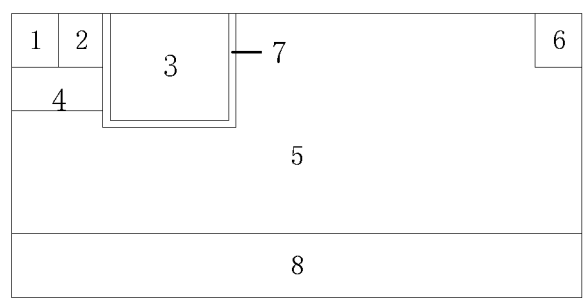
FIG. 3B is a cross section view along an ee' direction of Embodiment 3 according to the present invention.
Figure 3C:
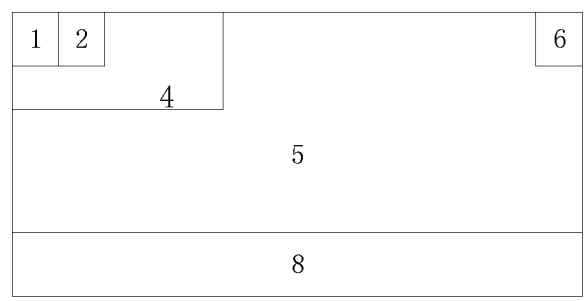
FIG. 3C is a cross section view along an ff' direction of Embodiment 3 according to the present invention.

As shown in FIG. 3A, FIG. 3B, and FIG. 3C, the difference between this embodiment and Embodiment 1 is: right boundaries of the dielectric layers 7 extend into the second type doping drift region 5, the right boundary of the first type polysilicon 3 is on the right side of the right boundary of the first type doping body 4; and the bottom of the first type doping body 4 is above the bottom of the first type polysilicon 3.

Embodiment 4

Figure 4A:
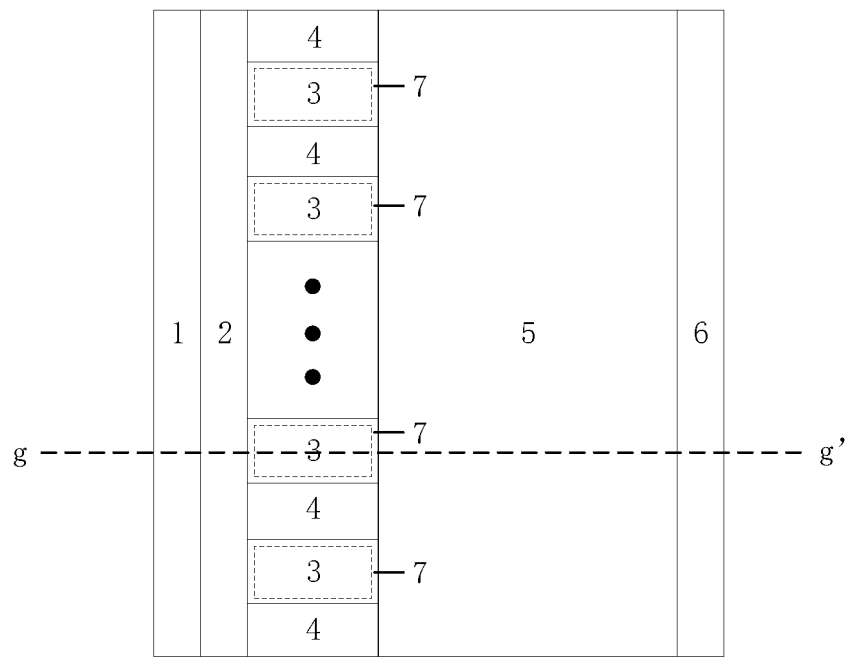
FIG. 4A is a top view of Embodiment 4 according to the present invention, and the embodiment avoids a surface current.
Figure 4B:
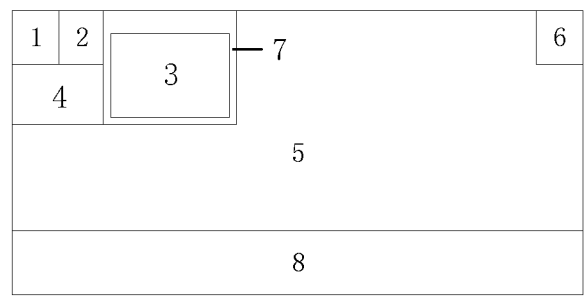
FIG. 4B is a cross section view along a gg' direction of Embodiment 4 according to the present invention.

As shown in FIG. 4A, FIG. 4B, and FIG. 4C, the difference between this embodiment and Embodiment 1 is: the bottom, two sides, and the upper part of the first type polysilicon 3 are all surrounded by the dielectric layer 7, and the upper boundary of the first type polysilicon 3 is separated from the upper boundary of the dielectric layer 7 by a certain distance. This embodiment aims to avoid a surface current, allow the current to pass through the body, and suppress a possible hot carrier injection effect.

Embodiment 5

Figure 5A:
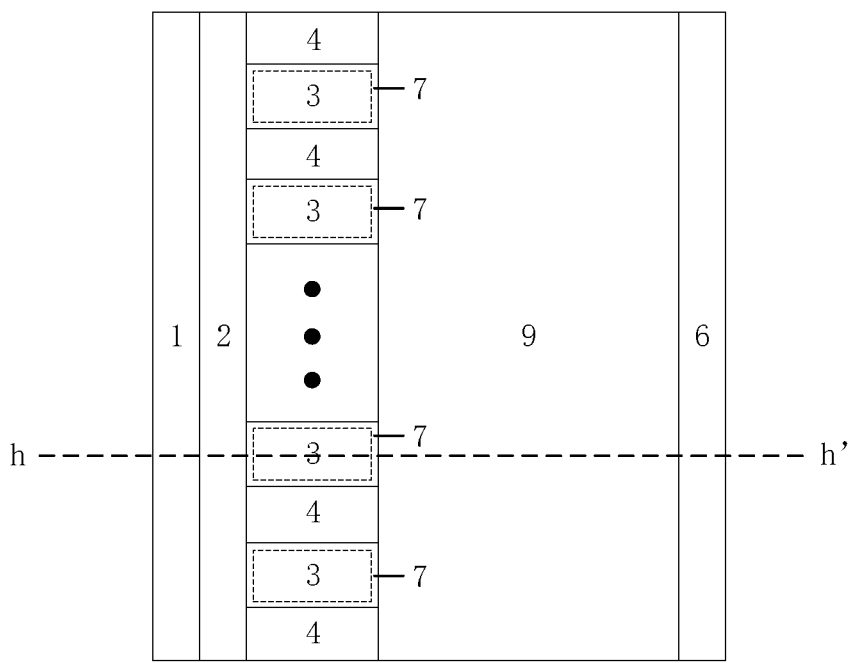
FIG. 5A is a top view of Embodiment 5 according to the present invention, and the embodiment introduces a field oxide layer.
Figure 5B:
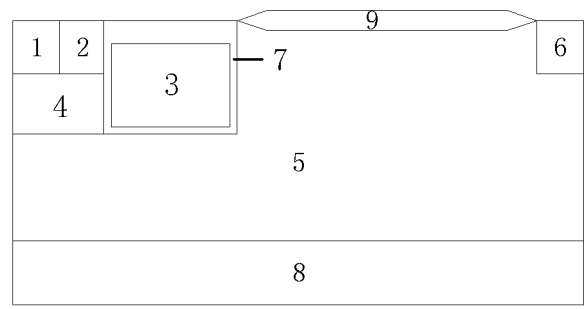
FIG. 5B is a cross section view along an hh' direction of Embodiment 5 according to the present invention.

As shown in FIG. 5A and FIG. 5B, the difference between this embodiment and Embodiment 4 is: a field oxide layer 9 is located on part of the upper surface of a second type doping drift region 5, the left side of the field oxide layer 9 contacts the dielectric layer 7, the right side of the field oxide layer 9 contacts the second type heavy doping drain 6, and the field oxide layer 9 extends downward into the second type doping drift region 5. This embodiment aims to avoid a surface current, allow the current to pass through the body, and suppress a possible hot carrier injection effect.

Embodiment 6

Figure 6A:
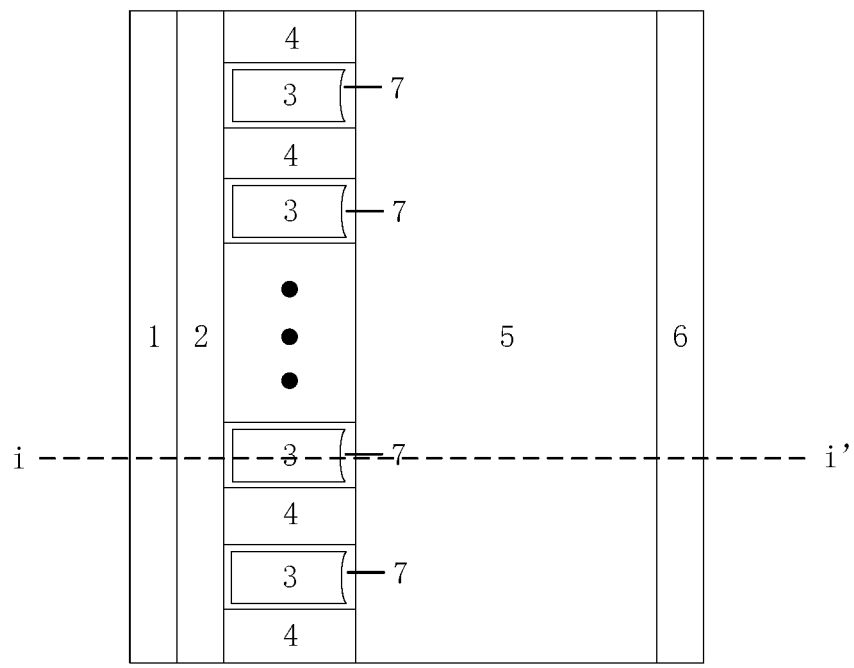
FIG. 6A is a top view of Embodiment 6 according to the present invention.
Figure 6B:
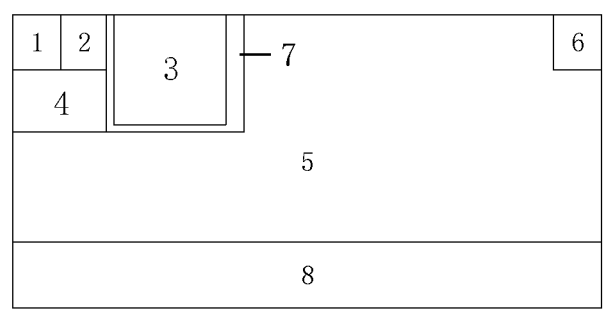
FIG. 6B is a cross section view along an ii' direction of Embodiment 6 according to the present invention.

As shown in FIG. 6A and FIG. 6B, the difference between this embodiment and Embodiment 1 is: the right boundary of the polysilicon 3 is an arc concave to the left. This embodiment aims to introduce a thickened gate oxide layer in the lateral direction to reduce a gate-to-drain capacitance.

Embodiment 7

Figure 7A:
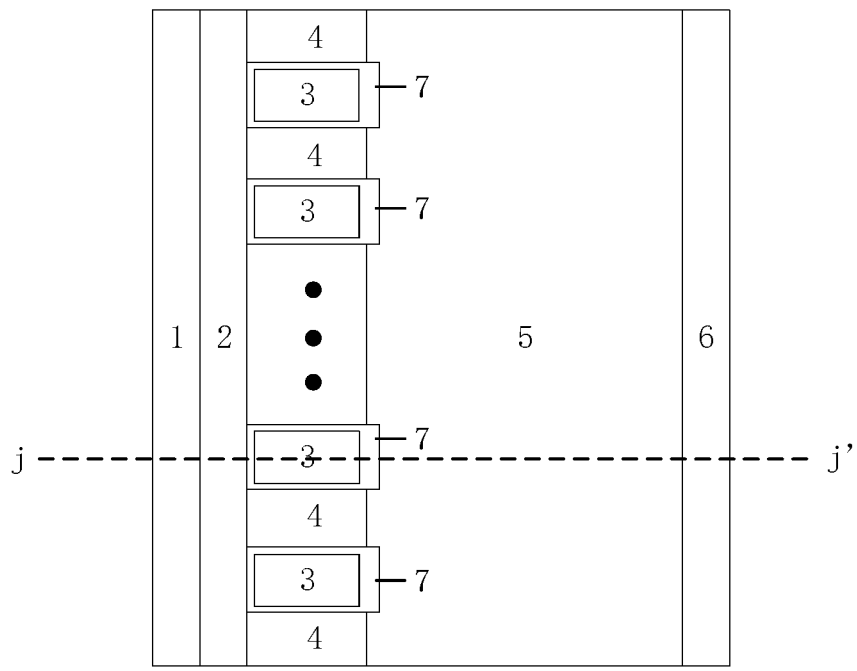
FIG. 7A is a top view of Embodiment 7 according to the present invention.
Figure 7B:
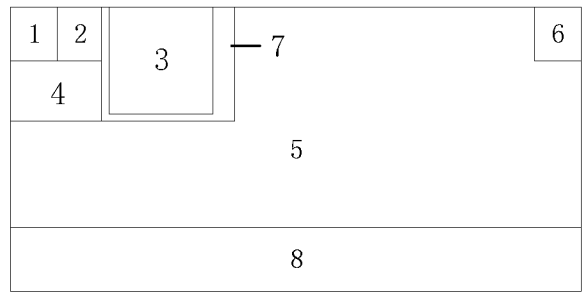
FIG. 7B is a cross section view along a jj' direction of Embodiment 7 according to the present invention.

As shown in FIG. 7A and FIG. 7B, the difference between this embodiment and Embodiment 1 is: right boundaries of the dielectric layers 7 extend to the right into the second type doping drift region 5; and the right boundary of the first type polysilicon 3 is on the left side of the right boundary of the first type doping body 4. The bottom of the first type doping body 4 is located below the bottom of the first type polysilicon 3. This embodiment aims to introduce a thickened gate oxide layer in the lateral direction to reduce a gate-to-drain capacitance.

Embodiment 8

Figure 8A:
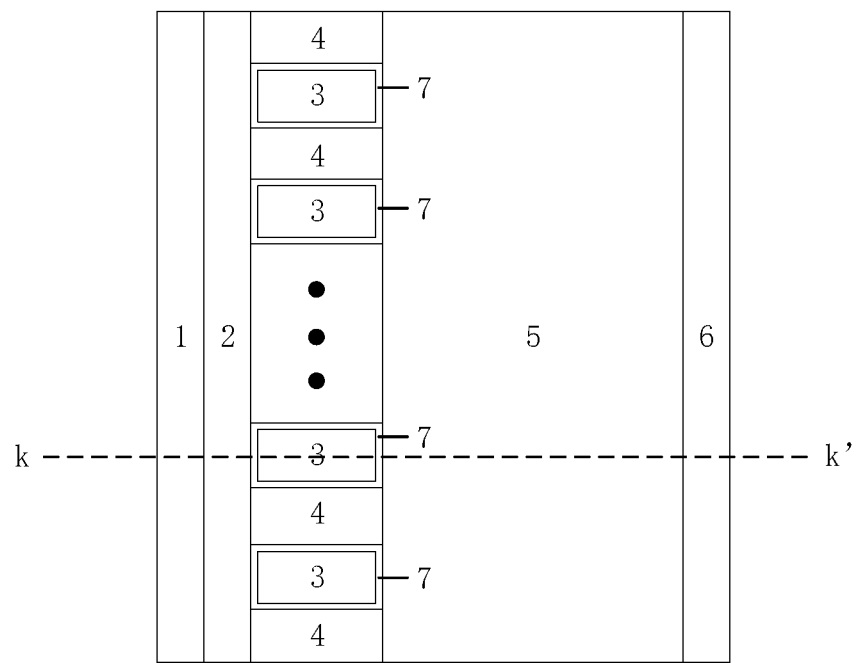
FIG. 8A is a top view of Embodiment 8 according to the present invention.
Figure 8B:
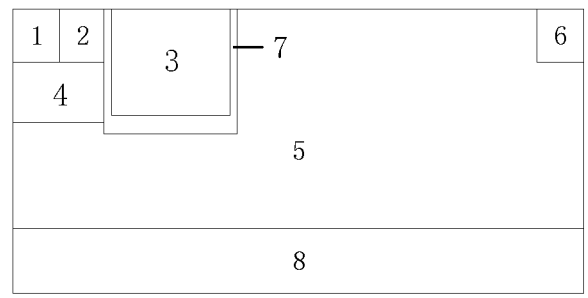
FIG. 8B is a cross section view along a kk' direction of Embodiment 8 according to the present invention.

As shown in FIG. 8A and FIG. 8B, the difference between this embodiment and Embodiment 1 is: the bottom of the first type polysilicon 3 is located above the lower boundary of the first type doping body 4; the bottom of the dielectric layer 7 is located below the bottom of the first type doping body 4, and a distance between the side face of the first type polysilicon 3 and the side face of the dielectric layer 7 is smaller than a distance between the bottom of the first type polysilicon 3 and the bottom of the dielectric layer 7. This embodiment aims to introduce a thickened gate oxide layer in the vertical direction to reduce a gate-to-drain capacitance.

Embodiment 9

Figure 9A:
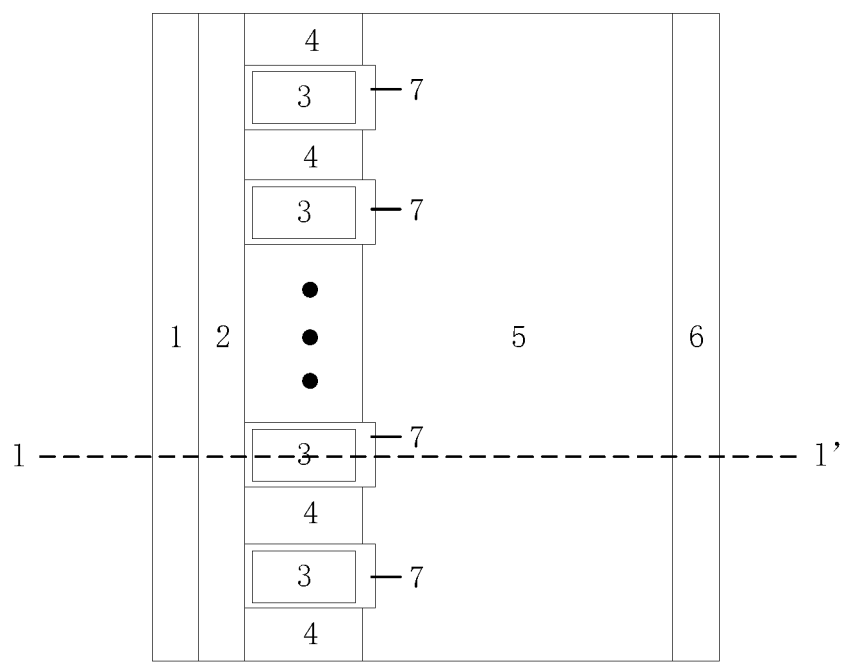
FIG. 9A is a top view of Embodiment 9 according to the present invention.
Figure 9B:
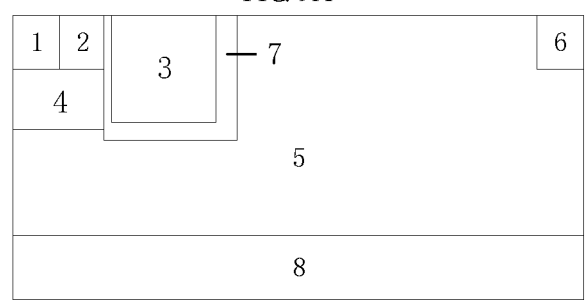
FIG. 9B is a cross section view along an ll' direction of Embodiment 9 according to the present invention.

As shown in FIG. 9A and FIG. 9B, the difference between this embodiment and Embodiment 1 is: right boundaries of the dielectric layers 7 extend to the right into the second type doping drift region 5; and the right boundary of the first type polysilicon 3 is on the left side of the right boundary of the first type doping body 4. The bottom of the first type polysilicon 3 is located above the lower boundary of the first type doping body 4; and the bottom of the dielectric layer 7 is located below the bottom of the first type doping body 4. This embodiment aims to introduce a thickened gate oxide layer in the vertical and lateral directions to reduce a gate-to-drain capacitance.

Embodiment 10

Figure 10A:
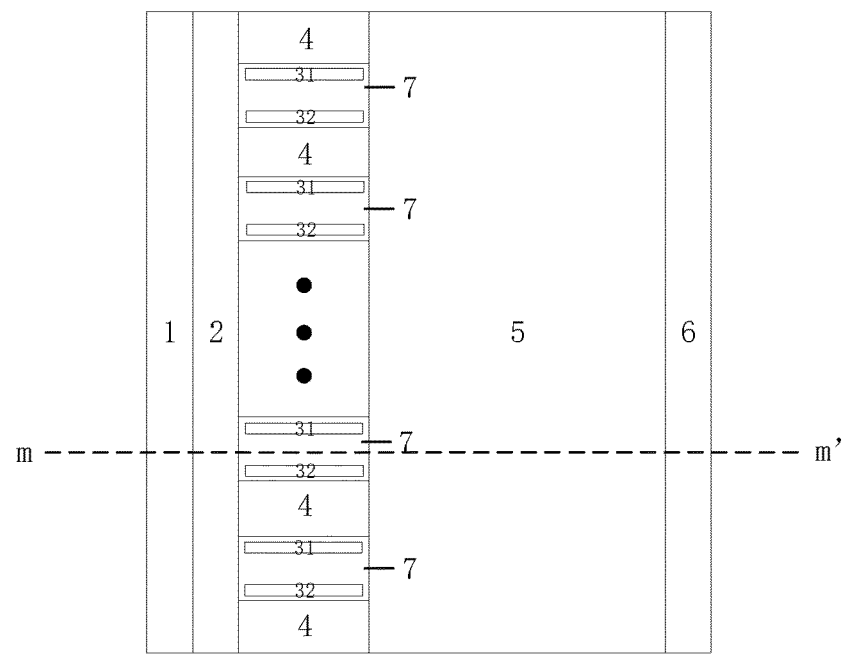
FIG. 10A is a top view of Embodiment 10 according to the present invention.
Figure 10B:
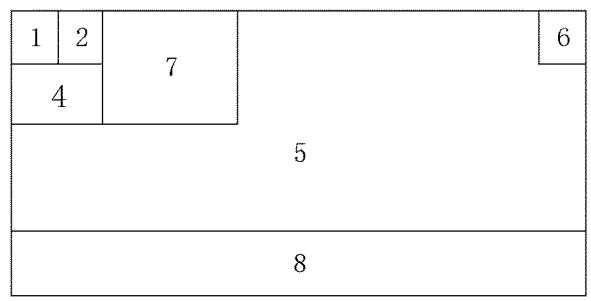
FIG. 10B is a cross section view along an mm' direction of Embodiment 10 according to the present invention.

As shown in FIG. 10A and FIG. 10B, the difference between this embodiment and Embodiment 1 is: polysilicon 3 in each dielectric layer 7 are divided into two parts: first polysilicon 31 and second polysilicon 32 in the longitudinal direction. This embodiment aims to reduce an overlap area of a gate and a drain, and reduce a gate-to-drain capacitance.

Embodiment 11

Figure 11A:
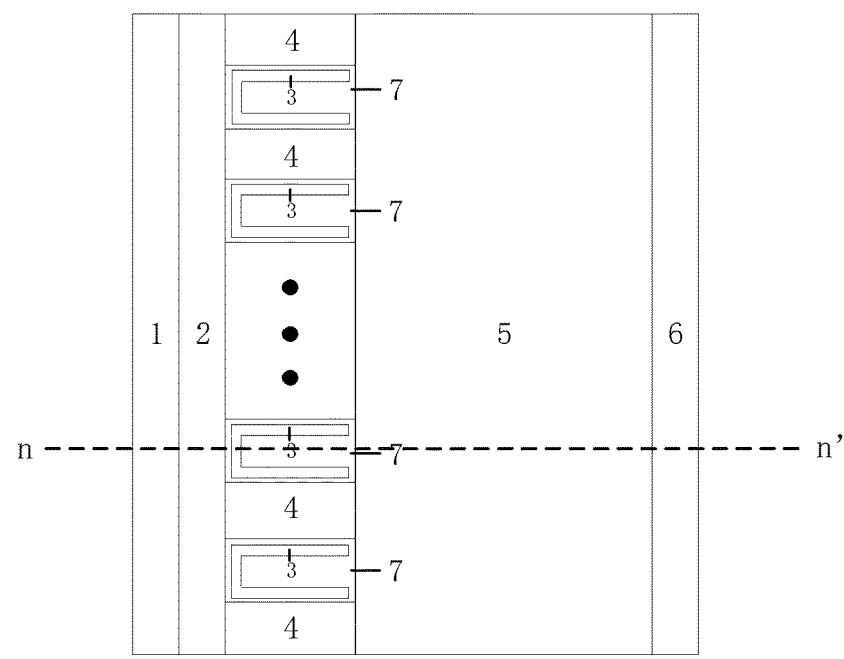
FIG. 11A is a top view of Embodiment 11 according to the present invention.
Figure 11B:
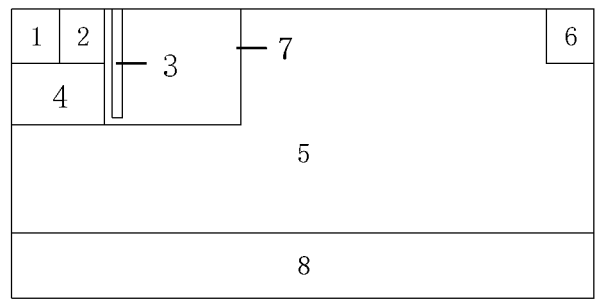
FIG. 11B is a cross section view along an nn' direction of Embodiment 11 according to the present invention.

As shown in FIG. 11A and FIG. 11B, the difference between this embodiment and Embodiment 1 is: the polysilicon 3 is U-shaped opening to the right. This embodiment aims to reduce an overlap area of a gate and a drain, and reduce a gate-to-drain capacitance.

Embodiment 12

Figure 12A:
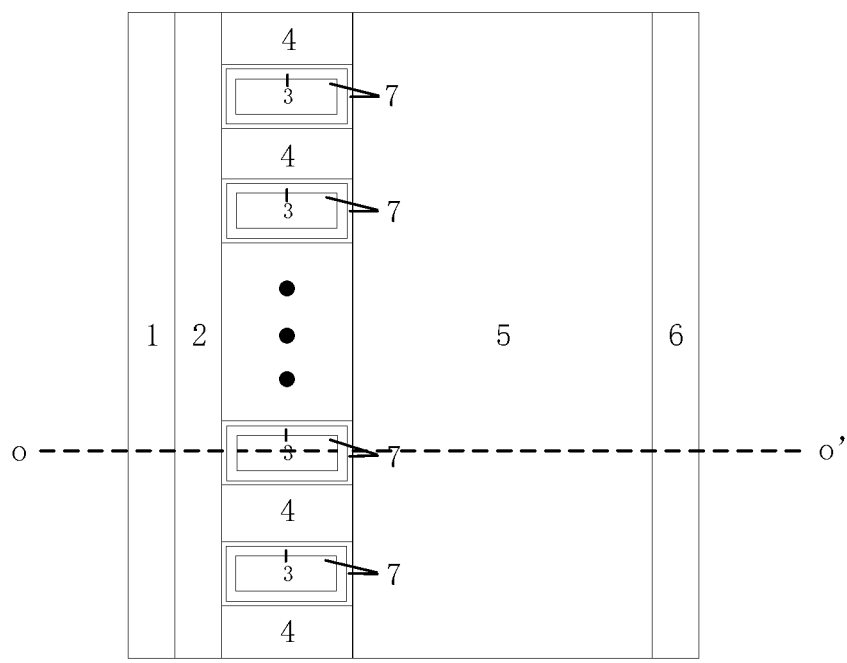
FIG. 12A is a top view of Embodiment 12 according to the present invention.
Figure 12B:
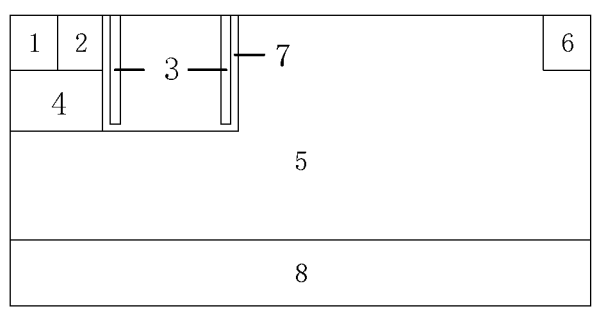
FIG. 12B is a cross section view along an oo' direction of Embodiment 12 according to the present invention.

As shown in FIG. 12A and FIG. 12B, the difference between this embodiment and Embodiment 1 is: the polysilicon 13 is a hollow square. This embodiment aims to reduce an overlap area of a gate and a drain, and reduce a gate-to-drain capacitance.

Embodiment 13

Figure 13A:
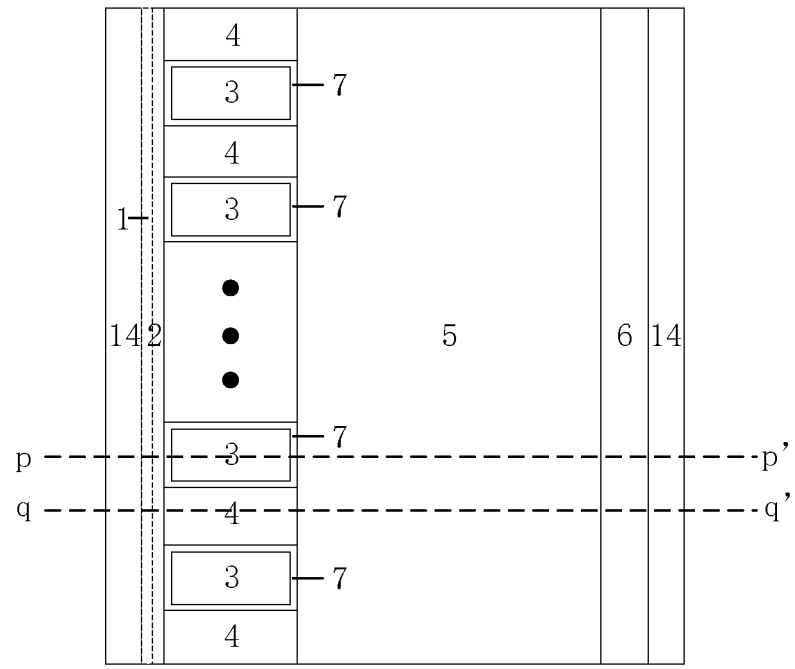
FIG. 13A is a top view of Embodiment 13 according to the present invention.
Figure 13B:
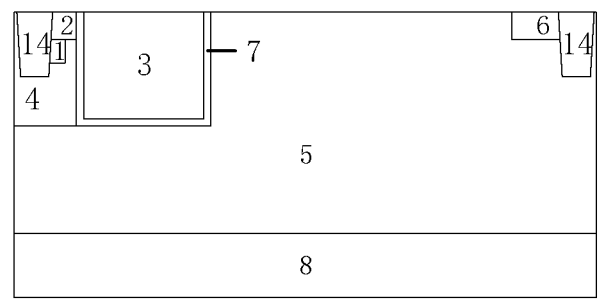
FIG. 13B is a cross section view along a pp' direction of Embodiment 13 according to the present invention.
Figure 13C:
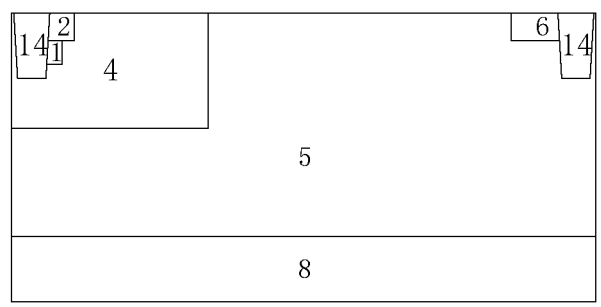
FIG. 13C is a cross section view along a qq' direction of Embodiment 13 according to the present invention.

As shown in FIG. 13A, FIG. 13B, and FIG. 13C, the difference between this embodiment and Embodiment 1 is: metals 14 are respectively located on the left side of the second type heavy doping source 2 and the right side of the second type heavy doping drain 6; the first type heavy doping body contact 1 is located below the left part of the second type heavy doping source 2, and left sides of both the first type heavy doping body contact 1 and the second type heavy doping source 2 contact the metal 14; the bottom of the metal 14 is below the bottom of the first type heavy doping body contact 1; the right side of the second type heavy doping drain 6 contacts the metal 14; and the bottom of the metal 14 is below the bottom of the second type heavy doping drain 6. This embodiment aims to increase a drain-source contact area through a deep groove metal, thereby reducing a contact resistance, maximizing the use of a drain-source conduction area, and increasing a current density.

Embodiment 14

Figure 14A:
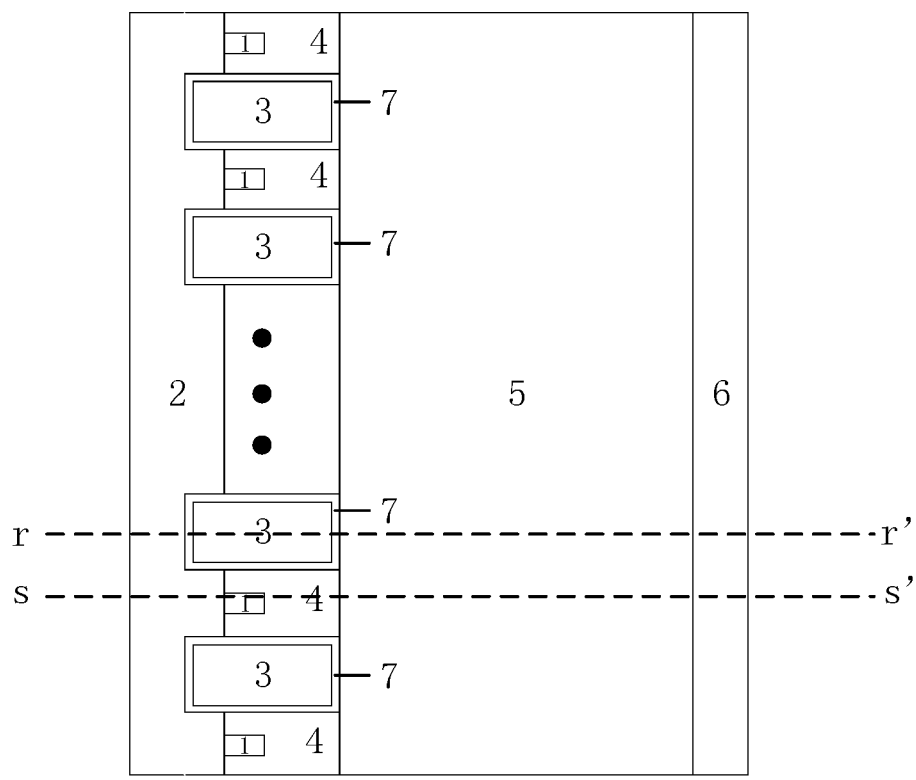
FIG. 14A is a top view of Embodiment 14 according to the present invention.
Figure 14B:
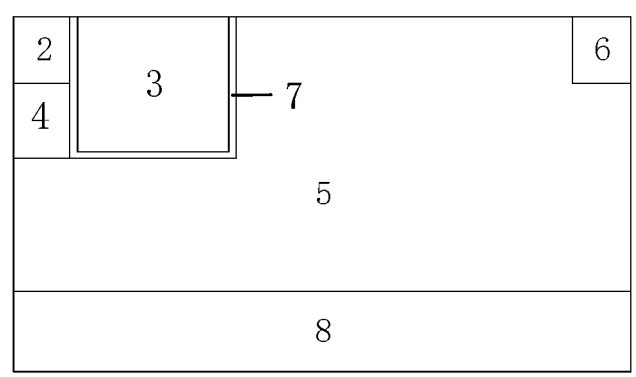
FIG. 14B is a cross section view along an rr' direction of Embodiment 14 according to the present invention.
Figure 14C:
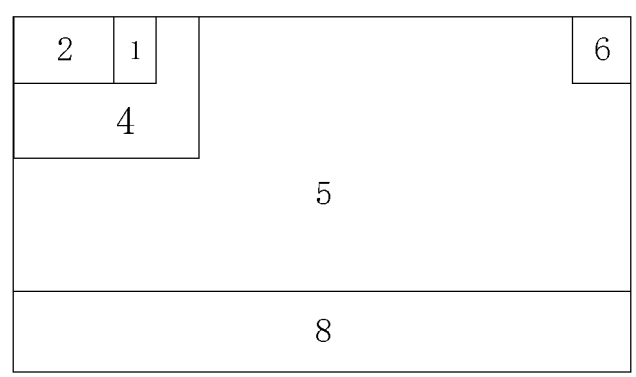
FIG. 14C is a cross section view along an ss' direction of Embodiment 14 according to the present invention.

As shown in FIG. 14A, FIG. 14B, and FIG. 14C, the difference between this embodiment and Embodiment 1 is: left sides of the dielectric layers 7 extend to the left into the second type heavy doping source 2; the first type heavy doping body contact 1 is in the first type doping body 4, and the left side of the first type heavy doping body contact 1 is tangent to the right side of the second type heavy doping source 2; and the first type heavy doping body contact 1 does not contact adjacent dielectric layers 7 in the longitudinal direction. In this embodiment, a channel region resistance is reduced by shortening a channel length, and the first type heavy doping body contact 1 is placed on the right side of the second type heavy doping source 2 to suppress a short channel effect.

Embodiment 15

Figure 15A:
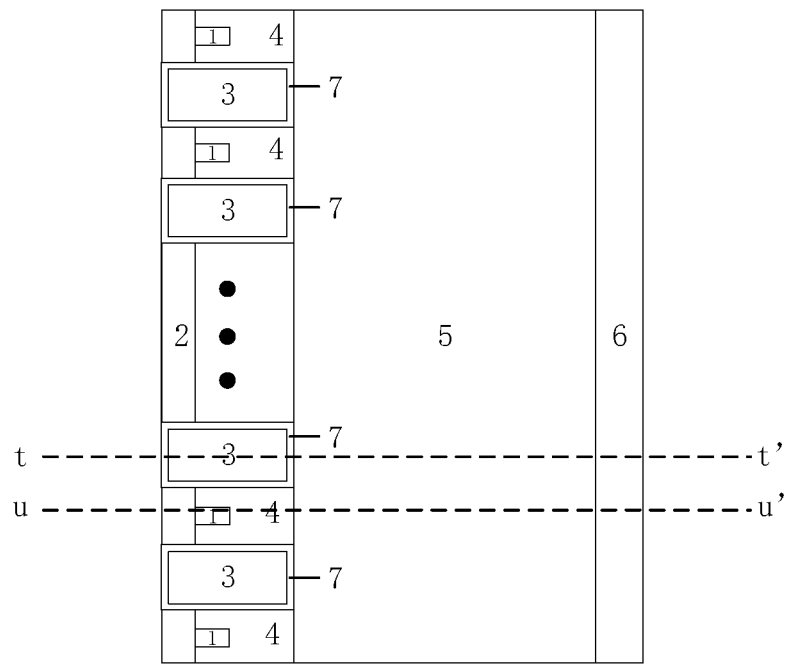
FIG. 15A is a top view of Embodiment 15 according to the present invention.
Figure 15B:
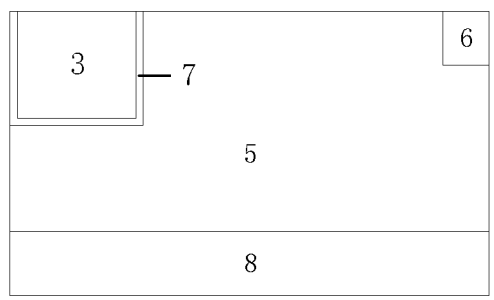
FIG. 15B is a cross section view along a tt' direction of Embodiment 15 according to the present invention.
Figure 15C:
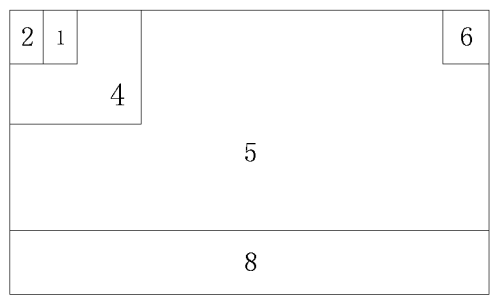
FIG. 15C is a cross section view along a uu' direction of Embodiment 15 according to the present invention.

As shown in FIG. 15A, FIG. 15B, and FIG. 15C, the difference between this embodiment and Embodiment 1 is: left sides of dielectric layers 7 are tangent to the left side of the second type heavy doping source 2; the first type heavy doping body contact 1 is in the first type doping body 4, and the left side of the first type heavy doping body contact 1 is tangent to the right side of the second type heavy doping source 2; and the first type heavy doping body contact 1 does not contact adjacent dielectric layers 7 in the longitudinal direction. In this embodiment, a channel region resistance is reduced by shortening a channel length, and the first type heavy doping body contact 1 is placed on the right side of the second type heavy doping source 2 to suppress a short channel effect.

Embodiment 16

Figure 16A:
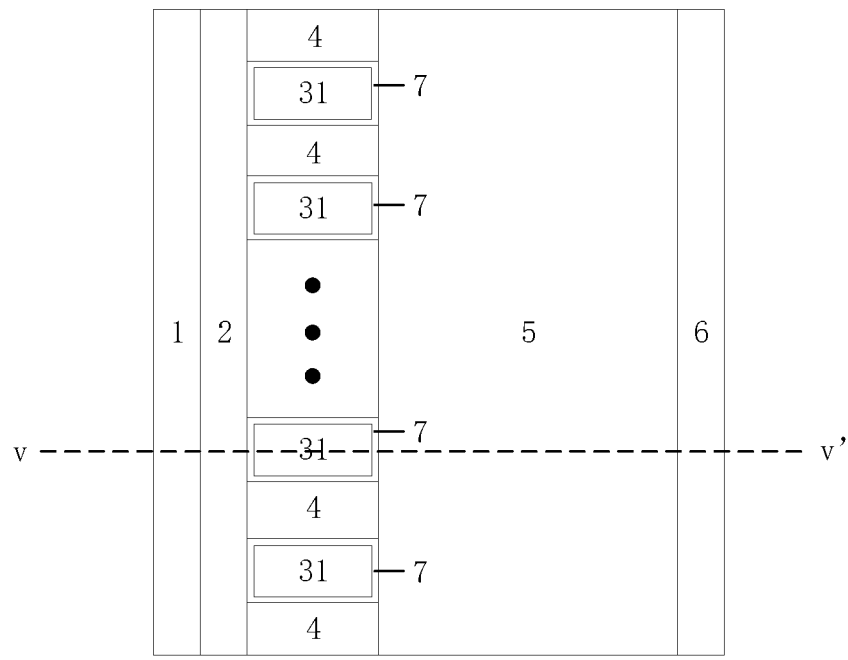
FIG. 16A is a top view of Embodiment 16 according to the present invention.
Figure 16B:
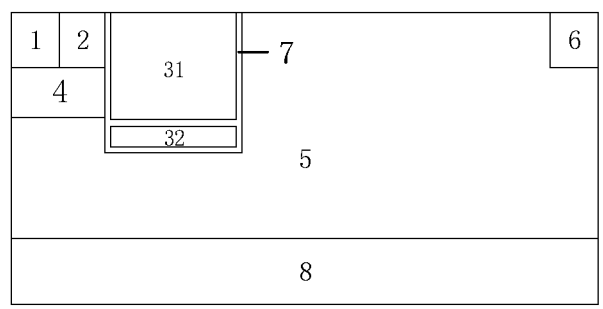
FIG. 16B is a cross section view along a vv' direction of Embodiment 16 according to the present invention.

As shown in FIG. 16A, FIG. 16B, and FIG. 16C, the difference between this embodiment and Embodiment 1 is: polysilicon 3 in each dielectric layer 7 are divided into two parts: first polysilicon 31 and second polysilicon 32 in the vertical direction. This embodiment aims to introduce a shielding gate in the vertical direction to reduce a gate-to-drain capacitance.

Embodiment 17

Figure 17A:
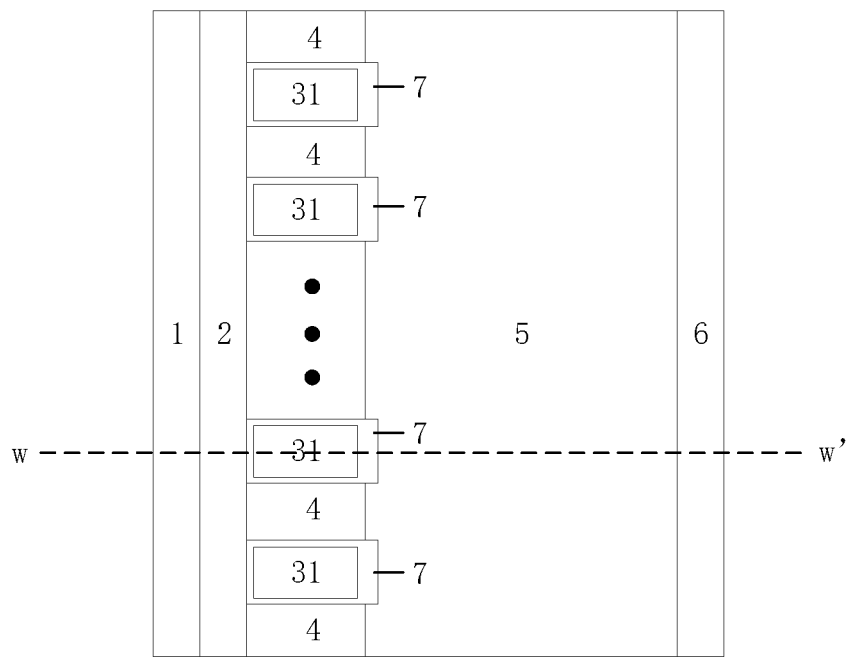
FIG. 17A is a top view of Embodiment 17 according to the present invention.
Figure 17B:
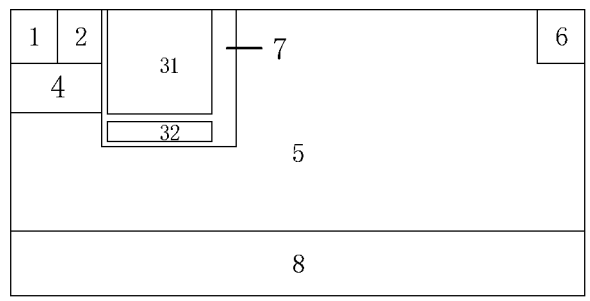
FIG. 17B is a cross section view along a ww' direction of Embodiment 17 according to the present invention.

As shown in FIG. 17A and FIG. 17B, the difference between this embodiment and Embodiment 16 is: right boundaries of the dielectric layers 7 extend to the right into the second type doping drift region 5. In the vertical direction, a distance between the bottom of the second polysilicon 32 and the bottom of the dielectric layer 7 is smaller than a distance between the right boundary of the first polysilicon 31 and the right boundary of the dielectric layer 7. This embodiment aims to introduce a shielding gate in the vertical direction and a thickened gate oxide layer thickness in the lateral direction to reduce a gate-to-drain capacitance.

Embodiment 18

Figure 18A:
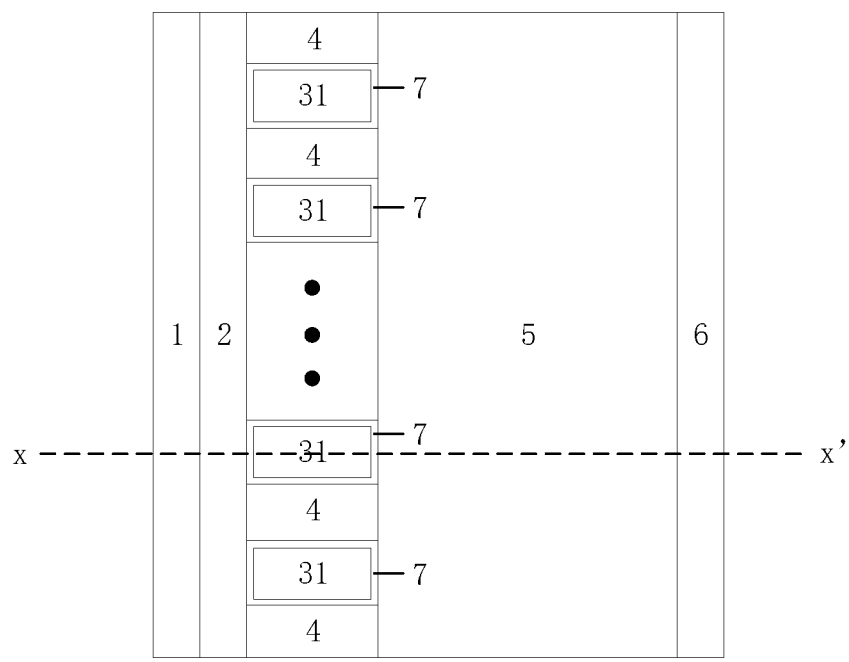
FIG. 18A is a top view of Embodiment 18 according to the present invention.
Figure 18B:
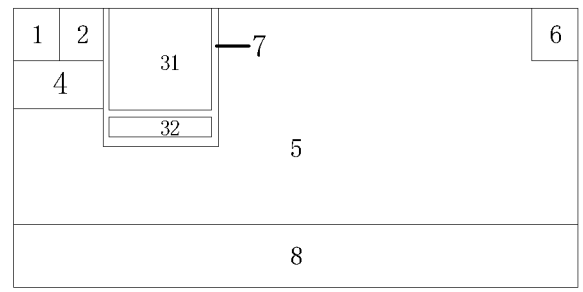
FIG. 18B is a cross section view along an xx' direction of Embodiment 18 according to the present invention.

As shown in FIG. 18A and FIG. 18B, the difference between this embodiment and Embodiment 16 is: in the vertical direction, a distance between the bottom of the second polysilicon 32 and the bottom of the dielectric layer 7 is greater than a distance between a side face of the first polysilicon 31 and a side face of the dielectric layer 7. This embodiment aims to introduce a shielding gate in the vertical direction and a thickened gate oxide layer thickness in the vertical direction to reduce a gate-to-drain capacitance.

Embodiment 19

Figure 19A:
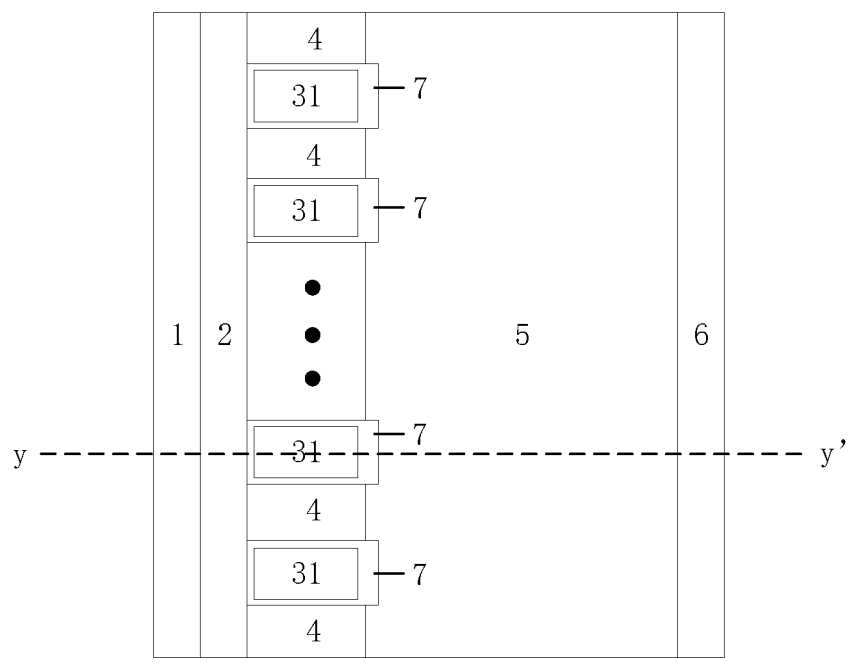
FIG. 19A is a top view of Embodiment 19 according to the present invention.
Figure 19B:
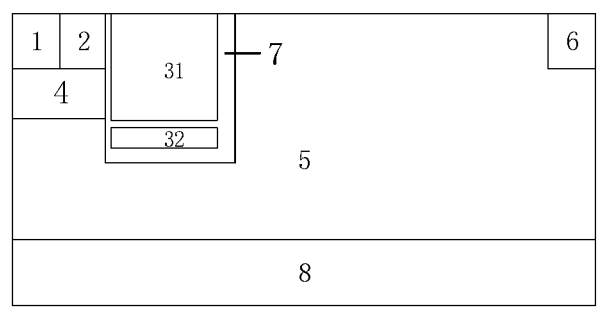
FIG. 19B is a cross section view along a yy' direction of Embodiment 19 according to the present invention.

As shown in FIG. 19A and FIG. 19B, the difference between this embodiment and Embodiment 16 is: right boundaries of the dielectric layers 7 extend to the right into the second type doping drift region 5, in the vertical direction, a distance between the bottom of the second polysilicon 32 and the bottom of the dielectric layer 7 is equal to a distance between the right boundary of the first polysilicon 31 and the right boundary of the dielectric layer 7, and both of the two distances are greater than a distance between the left boundary of the polysilicon 3 and the left boundary of the dielectric layer 7. This embodiment aims to introduce a shielding gate in the vertical direction and a thickened gate oxide layer thickness in the lateral and vertical directions to reduce a gate-to-drain capacitance.

Embodiment 20

Figure 20A:
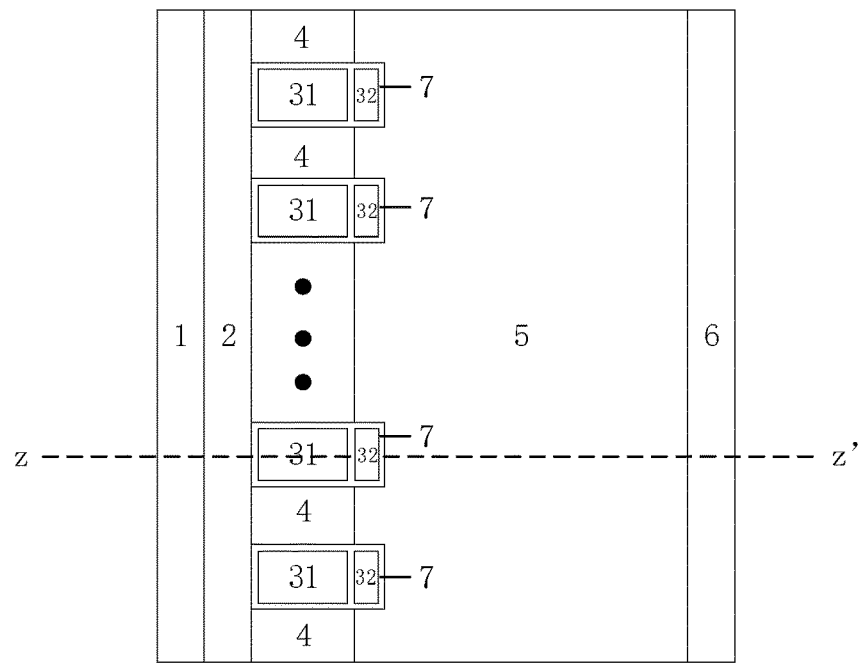
FIG. 20A is a top view of Embodiment 20 according to the present invention.
Figure 20B:
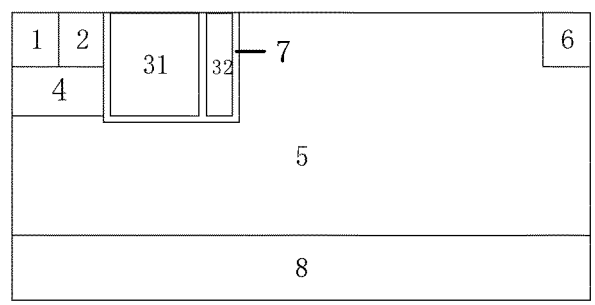
FIG. 20B is a cross section view along a zz' direction of Embodiment 20 according to the present invention.

As shown in FIG. 20A and FIG. 20B, the difference between this embodiment and Embodiment 1 is: polysilicon 3 in each dielectric layer 7 are divided into two parts: first polysilicon 31 and second polysilicon 32 in the lateral direction. Right boundaries of the dielectric layers 7 extend to the right into the second type doping drift region 5. This embodiment aims to introduce a shielding gate in the lateral direction to reduce a gate-to-drain capacitance.

Embodiment 21

Figure 21A:
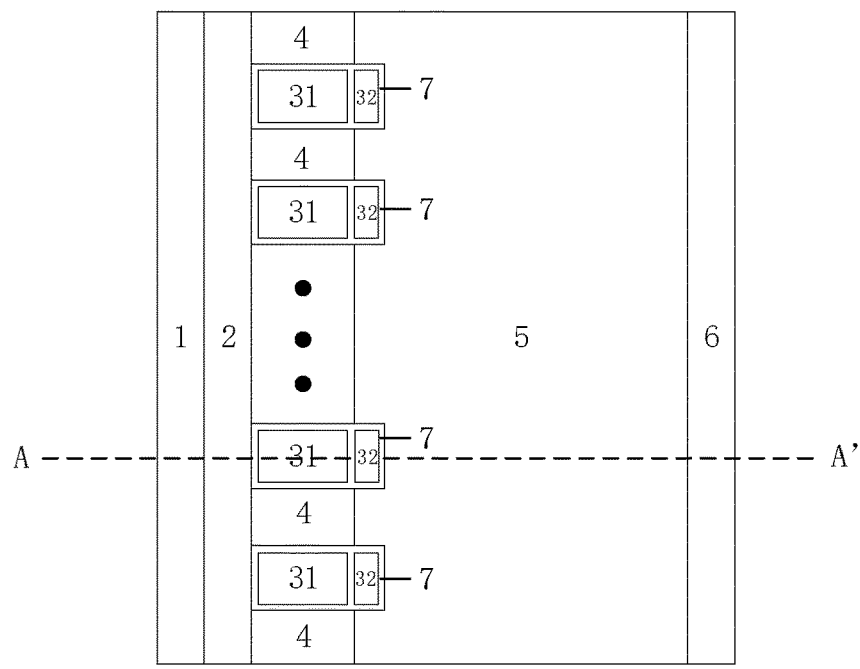
FIG. 21A is a top view of Embodiment 21 according to the present invention.
Figure 21B:
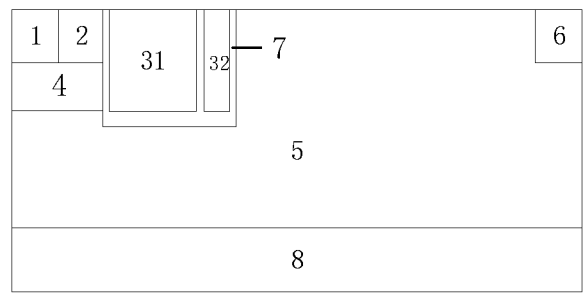
FIG. 21B is a cross section view along an AA' direction of Embodiment 21 according to the present invention.

As shown in FIG. 21A and FIG. 21B, the difference between this embodiment and Embodiment 20 is: a distance between bottoms of the first polysilicon 31 and the second polysilicon 32 and the bottom of the dielectric layer 7 is greater than a distance between two sides of the first polysilicon 31 and the second polysilicon 32 and the dielectric layer 7. This embodiment aims to introduce a shielding gate in the lateral direction and a thickened gate oxide layer thickness in the vertical direction to reduce a gate-to-drain capacitance.

Embodiment 22

Figure 22A:
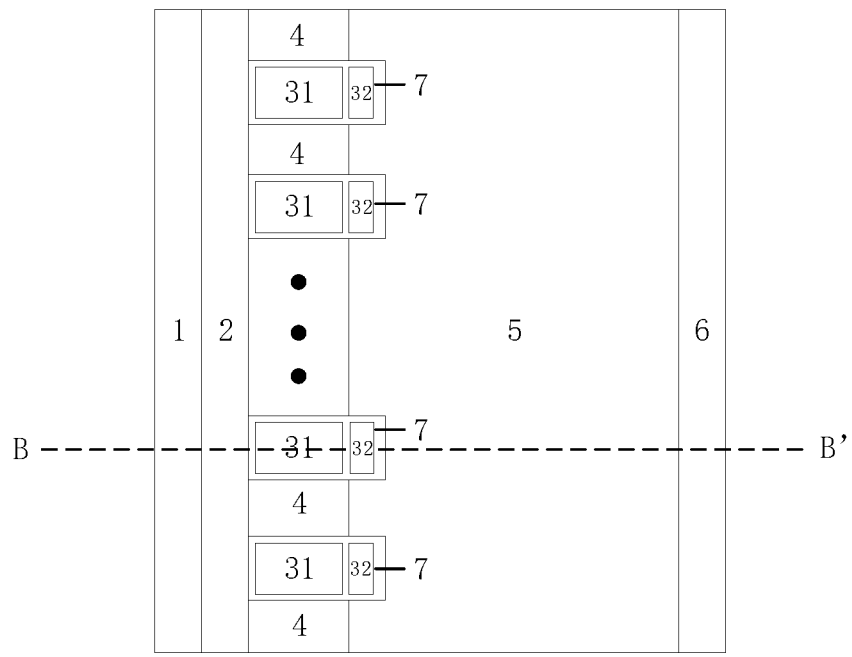
FIG. 22A is a top view of Embodiment 22 according to the present invention.
Figure 22B:
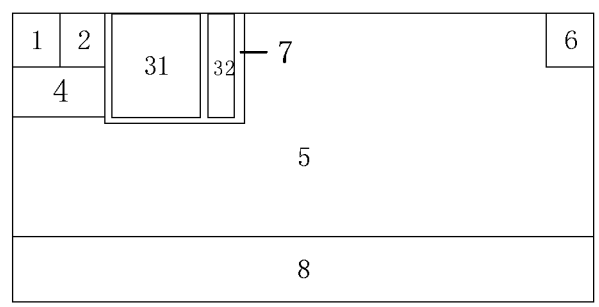
FIG. 22B is a cross section view along a BB' direction of Embodiment 22 according to the present invention.

As shown in FIG. 22A and FIG. 22B, the difference between this embodiment and Embodiment 20 is: a distance between the right boundary of the second polysilicon 32 and the right boundary of the dielectric layer 7 is greater than a distance between the left boundary of the first polysilicon 31 and the left boundary of the dielectric layer 7, and the distance between the right boundary of the second polysilicon 32 and the right boundary of the dielectric layer 7 is greater than a distance between bottoms of the first polysilicon 31 and the second polysilicon 32 and the bottom of the dielectric layer 7. This embodiment aims to introduce a shielding gate in the lateral direction and a thickened gate oxide layer thickness in the lateral direction to reduce a gate-to-drain capacitance.

Embodiment 23

Figure 23A:
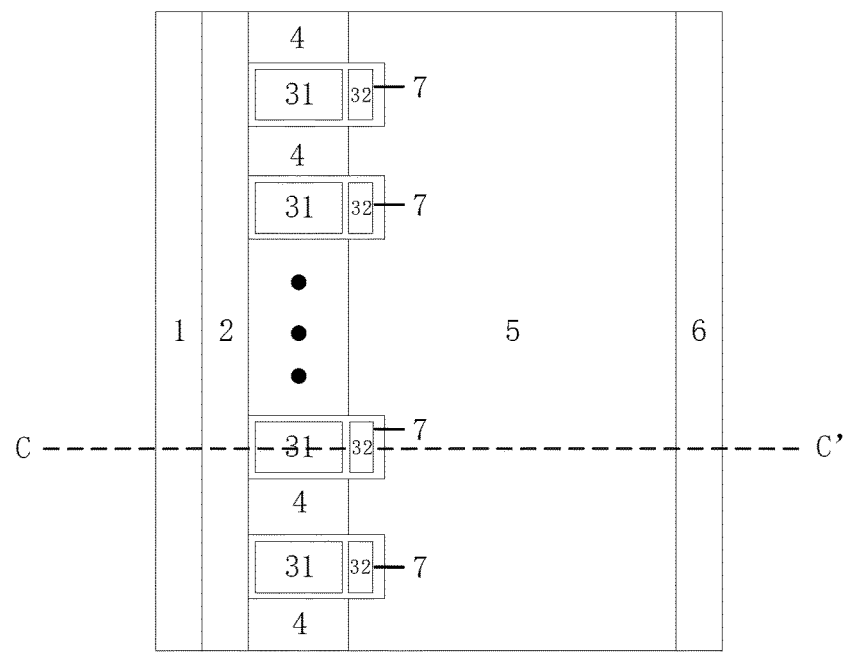
FIG. 23A is a top view of Embodiment 23 according to the present invention.
Figure 23B:
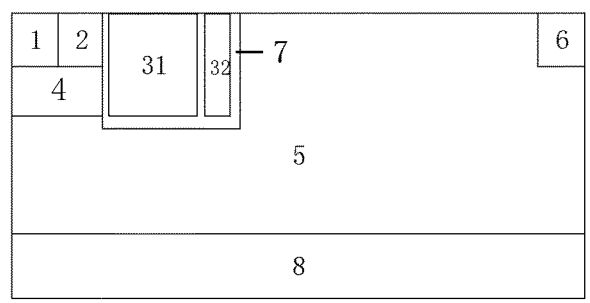
FIG. 23B is a cross section view along a CC' direction of Embodiment 23 according to the present invention.

As shown in FIG. 23A and FIG. 23B, the difference between this embodiment and Embodiment 20 is: a distance between the right boundary of the second polysilicon 32 and the right boundary of the dielectric layer 7 is greater than a distance between the left boundary of the first polysilicon 31 and the left boundary of the dielectric layer 7; and a distance between bottoms of the first polysilicon 31 and the second polysilicon 32 and the bottom of the dielectric layer 7 is greater than the distance between the left boundary of the first polysilicon 31 and the left boundary of the dielectric layer 7. This embodiment aims to introduce a shielding gate in the lateral direction and a thickened gate oxide layer thickness in the lateral and vertical directions to reduce a gate-to-drain capacitance.

Embodiment 24

Figure 24A:
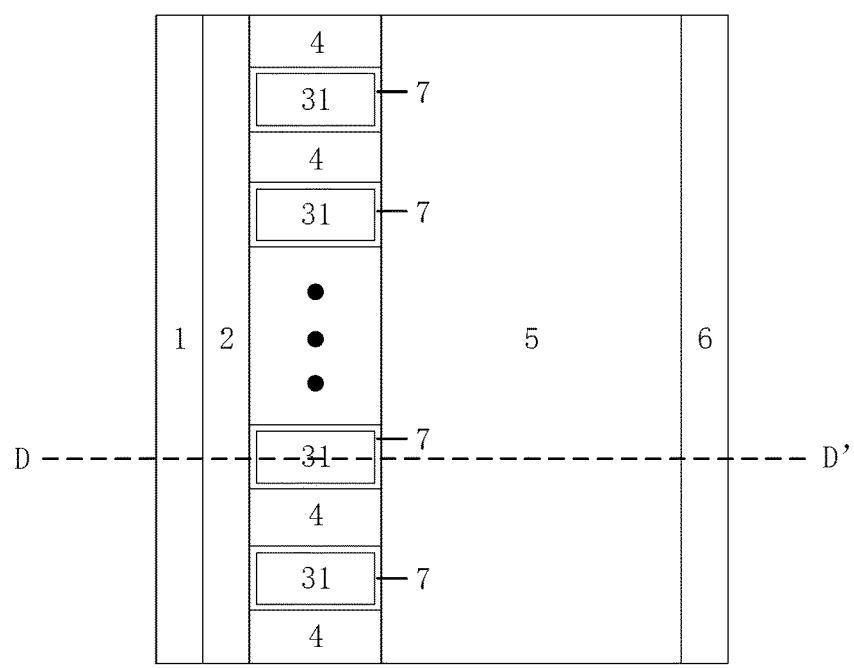
FIG. 24A is a top view of Embodiment 24 according to the present invention.
Figure 24B:
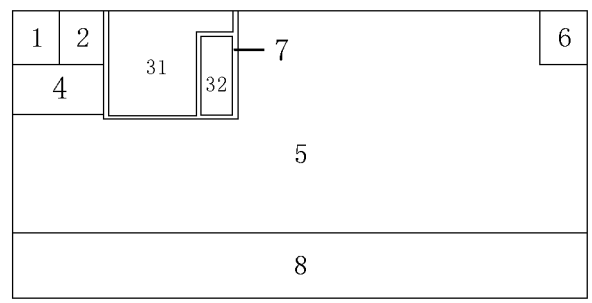
FIG. 24B is a cross section view along a DD' direction of Embodiment 24 according to the present invention.

As shown in FIG. 24A and FIG. 24B, the difference between this embodiment and Embodiment 20 is: the first polysilicon 31 is of an inverted "L" shape and the second polysilicon 32 is of a rectangular shape, and the second polysilicon 32 is located below the right side of the first polysilicon 31. This embodiment aims to introduce a partial shielding gate in the lateral direction to reduce a gate-to-drain capacitance.

Embodiment 25

Figure 25A:
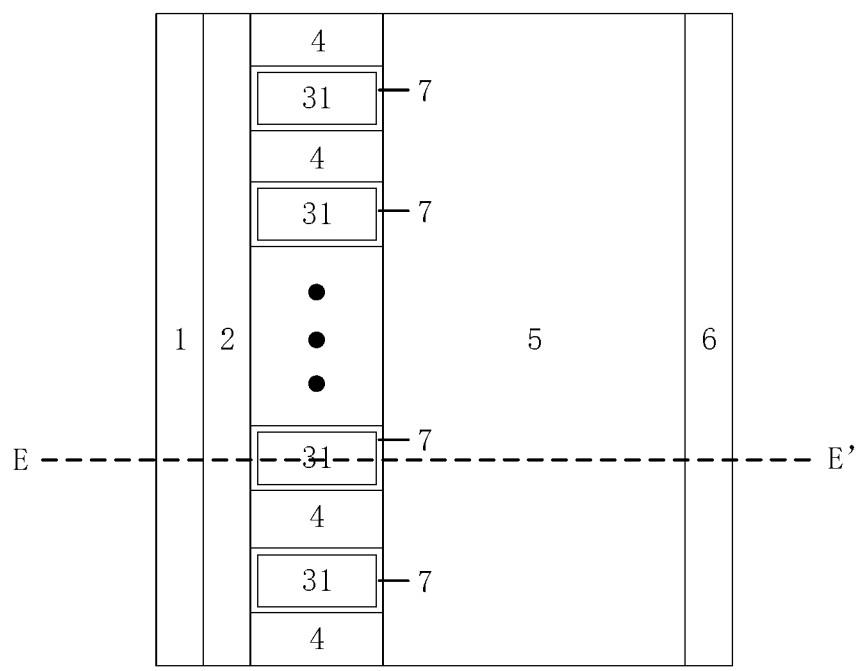
FIG. 25A is a top view of Embodiment 25 according to the present invention.
Figure 25B:
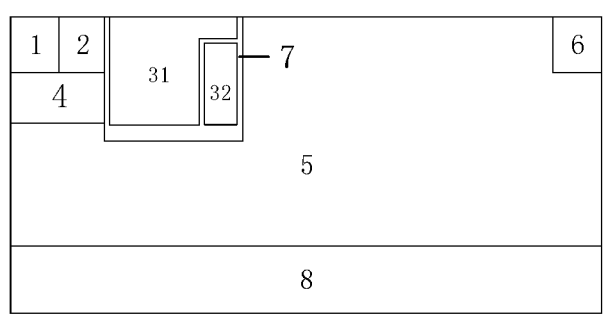
FIG. 25B is a cross section view along an EE' direction of Embodiment 25 according to the present invention.

As shown in FIG. 25A and FIG. 25B, the difference between this embodiment and Embodiment 24 is: a distance between bottoms of the first polysilicon 31 and the second polysilicon 32 and the bottom of the dielectric layer 7 is greater than a distance between side faces of the first polysilicon 31 and the second polysilicon 32 and the dielectric layer 7. This embodiment aims to introduce a partial shielding gate in the lateral direction and a partial thickened gate oxide layer thickness in the vertical direction to reduce a gate-to-drain capacitance.

Embodiment 26

Figure 26A:
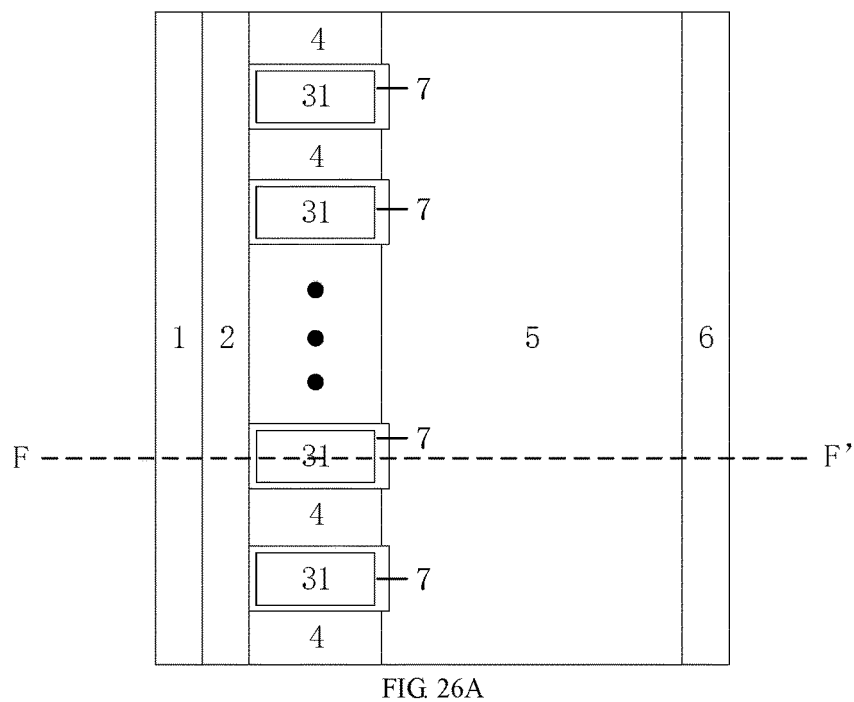
FIG. 26A is a top view of Embodiment 26 according to the present invention.
Figure 26B:
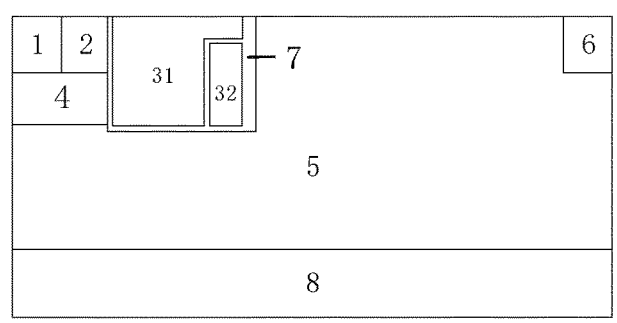
FIG. 26B is a cross section view along an FF' direction of Embodiment 26 according to the present invention.

As shown in FIG. 26A and FIG. 26B, the difference between this embodiment and Embodiment 24 is: a distance between the right boundary of the second polysilicon 32 and the right boundary of the dielectric layer 7 is greater than a distance between bottoms of the first polysilicon 31 and the second polysilicon 32 and the bottom of the dielectric layer 7. This embodiment aims to introduce a partial shielding gate in the lateral direction and a partial thickened gate oxide layer thickness in the lateral direction to reduce a gate-to-drain capacitance.

Embodiment 27

Figure 27A:
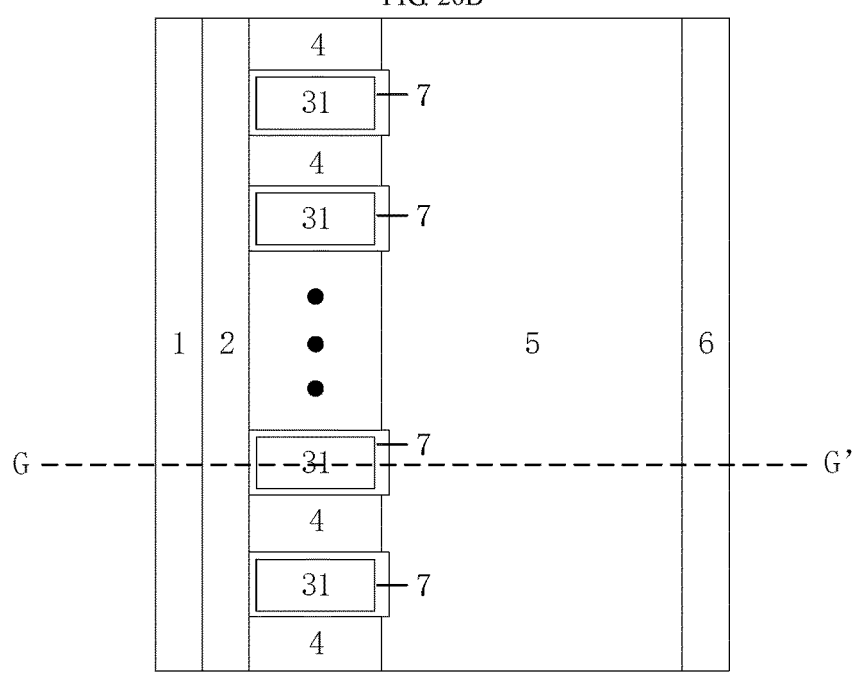
FIG. 27A is a top view of Embodiment 27 according to the present invention.
Figure 27B:
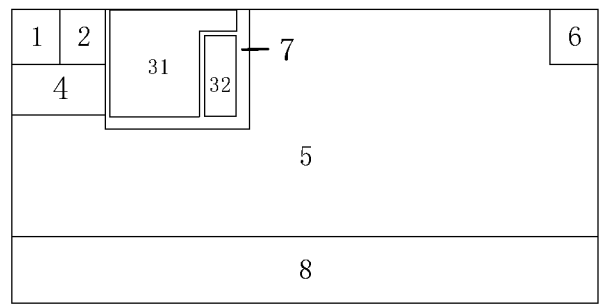
FIG. 27B is a cross section view along a GG' direction of Embodiment 27 according to the present invention.

As shown in FIG. 27A and FIG. 27B, the difference between this embodiment and Embodiment 26 is: both a distance between the right boundary of the second polysilicon 32 and the right boundary of the dielectric layer 7 and a distance between bottoms of the first polysilicon 31 and the second polysilicon 32 and the bottom of the dielectric layer 7 are greater than a distance between the left boundary of the first polysilicon 31 and the left boundary of the dielectric layer 7. This embodiment aims to introduce a partial shielding gate in the lateral direction and a partial thickened gate oxide layer thickness in the lateral and vertical directions to reduce a gate-to-drain capacitance.

Embodiment 28

Figure 28A:
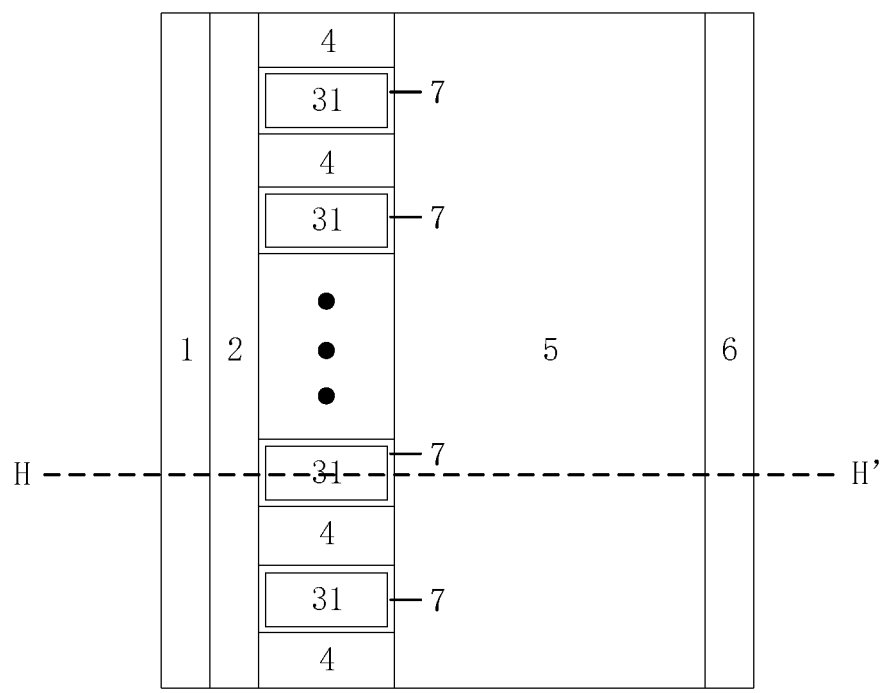
FIG. 28A is a top view of Embodiment 28 according to the present invention.
Figure 28B:
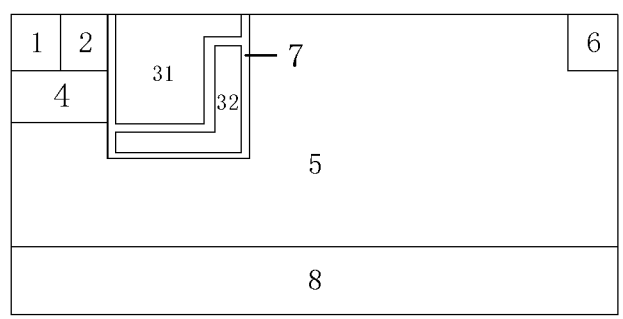
FIG. 28B is a cross section view along an HH' direction of Embodiment 28 according to the present invention.

As shown in FIG. 28A and FIG. 28B, the difference between this embodiment and Embodiment 26 is: the first polysilicon 31 is in the inverted "L" shape and the second polysilicon 32 is in the "L" shape. This embodiment aims to introduce a partial shielding gate in the lateral and vertical directions to reduce a gate-to-drain capacitance.

Embodiment 29

Figure 29A:
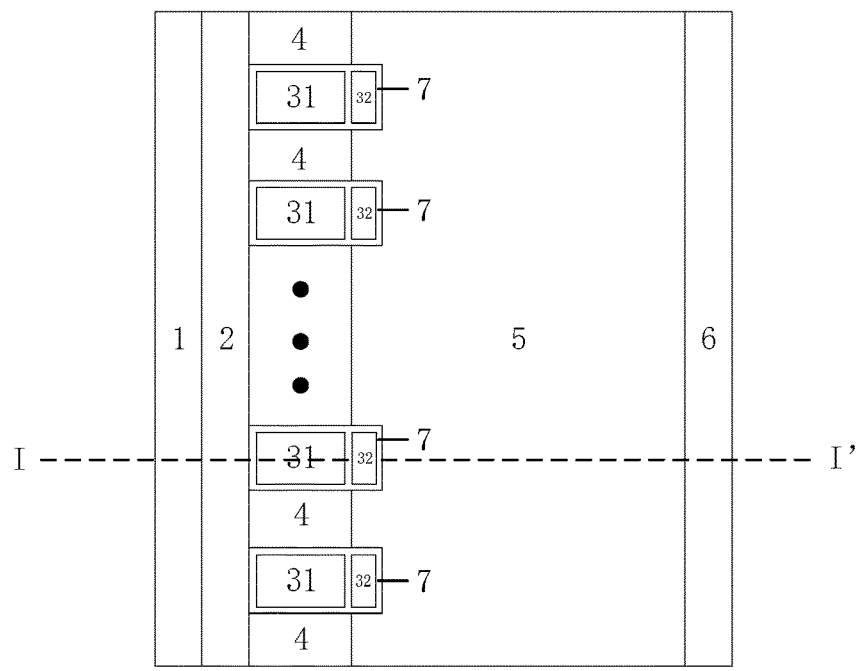
FIG. 29A is a top view of Embodiment 29 according to the present invention.
Figure 29B:
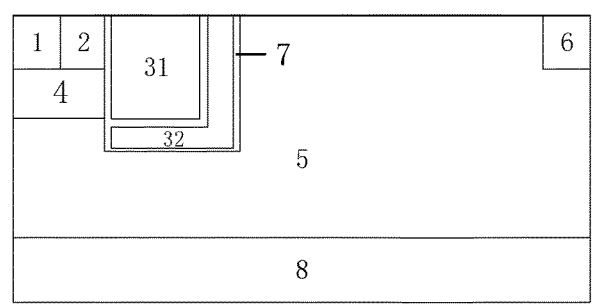
FIG. 29B is a cross section view along an II' direction of Embodiment 29 according to the present invention.

As shown in FIG. 29A and FIG. 29B, the difference between this embodiment and Embodiment 20 is:
the first polysilicon 31 is of a rectangular shape and the second polysilicon 32 is of an "L" shape, and the first polysilicon 31 is located at the upper left of the second polysilicon 32. This embodiment aims to introduce a shielding gate in the lateral and vertical directions to reduce a gate-to-drain capacitance.

Embodiment 30

Figure 30A:
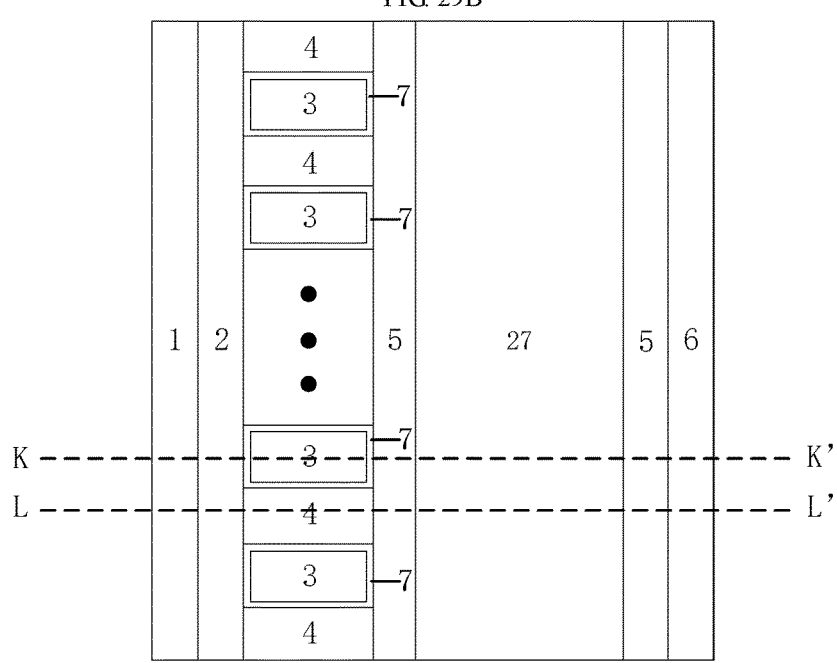
FIG. 30A is a top view of Embodiment 30 according to the present invention.
Figure 30B:
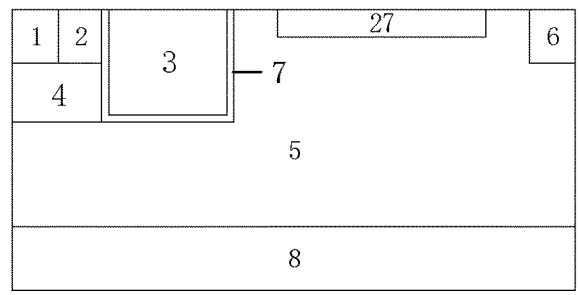
FIG. 30B is a cross section view along a KK' direction of Embodiment 30 according to the present invention.
Figure 30C:
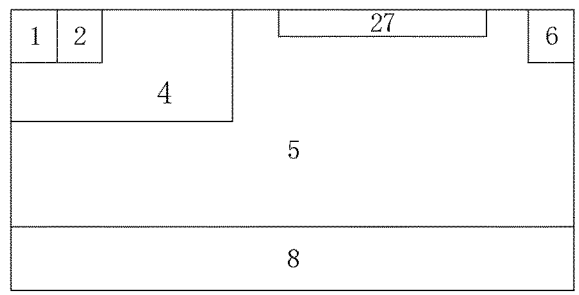
FIG. 30C is a cross section view along an LL' direction of Embodiment 30 according to the present invention.

As shown in FIG. 30A and FIG. 30B, the difference between this embodiment and Embodiment 1 is:
a first type doping surface layer region 27 is partially located over the second type doping drift region 5, and the upper surface of the first type doping surface layer region 27 is tangent to the upper surface of the second type doping drift region 5, the first type doping surface layer region 27 does not contact the dielectric layers 7 on the left side; and there is a certain distance between the first type doping surface layer region 27 and the second type heavy doping drain 6 on the right side. This embodiment aims to introduce the first type doping surface layer region to form a double RESURF structure, thereby reducing a drift region resistance.

Embodiment 31

Figure 31A:
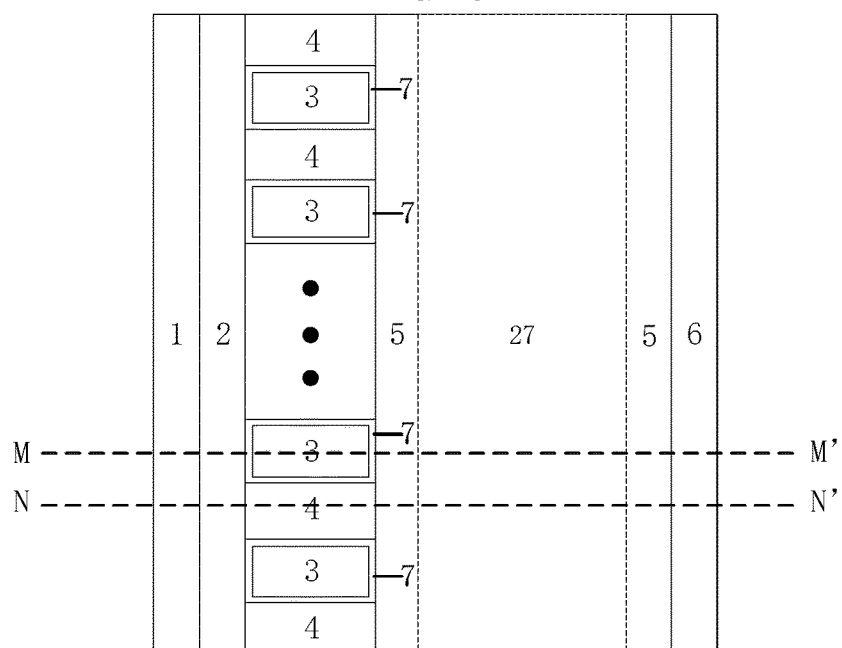
FIG. 31A is a top view of Embodiment 31 according to the present invention.
Figure 31B:
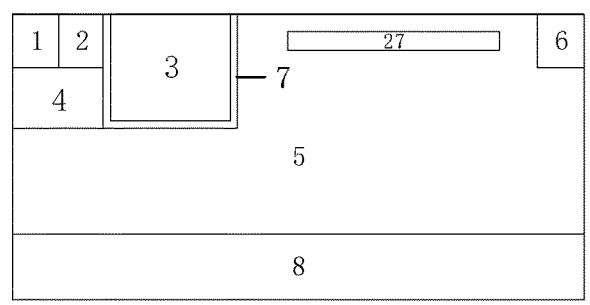
FIG. 31B is a cross section view along an MM' direction of Embodiment 31 according to the present invention.
Figure 31C:
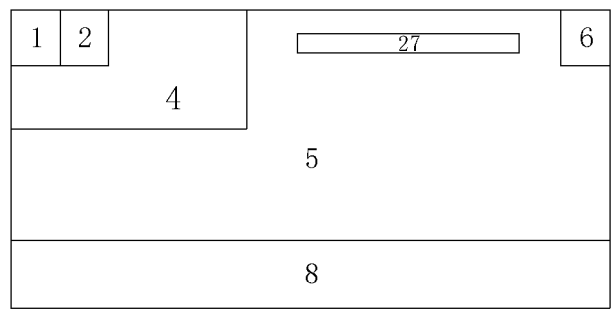
FIG. 31C is a cross section view along an NN' direction of Embodiment 31 according to the present invention.

As shown in FIG. 31A and FIG. 31B, the difference between this embodiment and Embodiment 1 is: a first type doping surface layer region 27 is partially located over the second type doping drift region 5, and the upper surface of the first type doping surface layer region 27 is separated from the upper surface of the second type doping drift region 5 by a certain distance.

The first type doping surface layer region 27 does not contact the dielectric layers 7 on the left side; and there is a certain distance between the first type doping surface layer region 27 and the second type heavy doping drain 6 on the right side. This embodiment aims to introduce the first type doping surface layer region to form a triple RESURF structure, thereby reducing a drift region resistance.

The embodiments mentioned above only illustrate the principles and effects of the present invention through examples, and are not used to limit the present invention. Anyone familiar with this technology may modify or change the embodiments mentioned above without departing from the spirit and scope of the present invention. Therefore, all equivalent modifications or changes made by those with ordinary knowledge in the technical fields without departing from the spirit and technical ideas disclosed in the present invention should still be covered by the claims of the present invention.

The invention claimed is:

1. A lateral power semiconductor device, comprising: a first type doping substrate at a bottom of the lateral power semiconductor device, a second type doping drift region above the first type doping substrate, a second type heavy doping drain located at an upper right of the second type doping drift region, and a first type doping body located at an upper left in the second type doping drift region; wherein
a first type heavy doping body contact and a second type heavy doping source are provided at an upper left in the first type doping body, and dielectric layers are on a right side of the second type heavy doping source;
a lateral direction refers to a direction from the first type heavy doping body contact to the second type heavy doping drain in a plane parallel to a surface of the lateral power semiconductor device, a longitudinal direction refers to a direction perpendicular to the lateral direction in the plane, and a vertical direction refers to a direction perpendicular to the plane;
the dielectric layers are arranged at intervals in the longitudinal direction in the first type doping body, and the first type doping body is between adjacent dielectric layers in the longitudinal direction; and a polysilicon is partially or completely surrounded by a dielectric layer of the dielectric layers;
a distance between a right boundary of the polysilicon and a right boundary of the dielectric layer is a, a distance between a bottom of the polysilicon and a bottom of the dielectric layer is b, a>b, or a<b, or a=b, and both a and b are greater than a distance between a left boundary of the polysilicon and a left boundary of the dielectric layer; and
the right boundary of the polysilicon is an arc concave to a left.

2. The lateral power semiconductor device according to claim 1, wherein a right boundary of the first type heavy doping body contact is tangent to a left boundary of the second type heavy doping source, a right boundary of the second type heavy doping source is tangent to a left boundary of the dielectric layer; or
left sides of the dielectric layers extend to a left into the second type heavy doping source; and a left side of the first type heavy doping body contact is tangent to the right side of the second type heavy doping source; and the first type heavy doping body contact does not contact the adjacent dielectric layers in the longitudinal direction.

3. The lateral power semiconductor device according to claim 1, wherein a right boundary of the polysilicon is on a left side of a right boundary of the first type doping body; or the right boundary of the polysilicon is aligned with the right boundary of the first type doping body; or the right boundary of the polysilicon is on a right side of the right boundary of the first type doping body.

4. The lateral power semiconductor device according to claim 1, wherein an upper boundary of the polysilicon is tangent to an upper boundary of the dielectric layer, or the upper boundary of the polysilicon is separated from the upper boundary of the dielectric layer by a certain distance.

5. The lateral power semiconductor device according to claim 1, wherein a bottom of the polysilicon is aligned with a bottom of the first type doping body; or the bottom of the polysilicon is located above the bottom of the first type doping body; or the bottom of the polysilicon is located below the bottom of the first type doping body.

6. The lateral power semiconductor device according to claim 1, wherein a field oxide layer is located on a part of an upper surface of the second type doping drift region, a left side of the field oxide layer contacts the dielectric layer, a right side of the field oxide layer contacts the second type heavy doping drain, and the field oxide layer extends downward into the second type doping drift region.

7. The lateral power semiconductor device according to of claim 1, wherein polysilicon in each dielectric layer are divided into first polysilicon and second polysilicon in the longitudinal direction, the lateral direction, or the vertical direction; or
the polysilicon is a U-shaped opening to a right; or
the polysilicon is a hollow square.

8. The lateral power semiconductor device according to claim 7, wherein the polysilicon in each dielectric layer are divided into the first polysilicon on a left side and the second polysilicon on a right side in the lateral direction; or
the polysilicon in each dielectric layer are divided into the first polysilicon on an upper part and the second polysilicon on a lower part in the longitudinal direction; or
the polysilicon in each dielectric layer are divided into the first polysilicon on the upper part and the second polysilicon on the lower part in the vertical direction; wherein
a first distance between a right side of the second polysilicon and a right side of the dielectric layer is c, a second distance between a bottom of the second polysilicon and a bottom of the dielectric layer is d, a third distance between a left side of the first polysilicon and a left side of the dielectric layer is e, and a relationship between the first distance, the second distance and the third distance is as follows:

$c>d$ and $d=e$; or $c<d$ and $c=e$; or $c>e$ and $d>e$.

9. The lateral power semiconductor device according to claim 8, wherein the first polysilicon is of an inverted "L" shape and the second polysilicon is of a rectangular shape, and the second polysilicon is located below a right side of the first polysilicon; or
the first polysilicon is of the rectangular shape and the second polysilicon is of an "L" shape, and the first polysilicon is located at an upper left of the second polysilicon; or
the first polysilicon is of the inverted "L" shape and the second polysilicon is of the "L" shape.

10. The lateral power semiconductor device according to claim 2, wherein a right boundary of the polysilicon is on a left side of a right boundary of the first type doping body; or the right boundary of the polysilicon is aligned with the right boundary of the first type doping body; or the right boundary of the polysilicon is on a right side of the right boundary of the first type doping body.

11. The lateral power semiconductor device according to claim 2, wherein an upper boundary of the polysilicon is tangent to an upper boundary of the dielectric layer, or the upper boundary of the polysilicon is separated from the upper boundary of the dielectric layer by a certain distance.

12. The lateral power semiconductor device according to claim 2, wherein a bottom of the polysilicon is aligned with a bottom of the first type doping body; or the bottom of the polysilicon is located above the bottom of the first type doping body; or the bottom of the polysilicon is located below the bottom of the first type doping body.

13. The lateral power semiconductor device according to claim 2, wherein a distance between a right boundary of the polysilicon and a right boundary of the dielectric layer is a, a distance between a bottom of the polysilicon and a bottom of the dielectric layer is b, a>b, or a<b, or a=b, and both a and b are greater than a distance between a left boundary of the polysilicon and a left boundary of the dielectric layer.

14. The lateral power semiconductor device according to claim 3, wherein a distance between a right boundary of the polysilicon and a right boundary of the dielectric layer is a, a distance between a bottom of the polysilicon and a bottom of the dielectric layer is b, a>b, or a<b, or a=b, and both a and b are greater than a distance between a left boundary of the polysilicon and a left boundary of the dielectric layer.

15. The lateral power semiconductor device according to claim 4, wherein a distance between a right boundary of the polysilicon and a right boundary of the dielectric layer is a, a distance between a bottom of the polysilicon and a bottom of the dielectric layer is b, a>b, or a<b, or a=b, and both a and b are greater than a distance between a left boundary of the polysilicon and a left boundary of the dielectric layer.

16. The lateral power semiconductor device according to claim 5, wherein a distance between a right boundary of the polysilicon and a right boundary of the dielectric layer is a, a distance between a bottom of the polysilicon and a bottom of the dielectric layer is b, a>b, or a<b, or a=b, and both a and b are greater than a distance between a left boundary of the polysilicon and a left boundary of the dielectric layer.

17. A lateral power semiconductor device, comprising: a first type doping substrate at a bottom of the lateral power semiconductor device, a second type doping drift region above the first type doping substrate, a second type heavy doping drain located at an upper right of the second type doping drift region, and a first type doping body located at an upper left in the second type doping drift region; wherein
   a first type heavy doping body contact and a second type heavy doping source are provided at an upper left in the first type doping body, and dielectric layers are on a right side of the second type heavy doping source;
   a lateral direction refers to a direction from the first type heavy doping body contact to the second type heavy doping drain in a plane parallel to a surface of the lateral power semiconductor device, a longitudinal direction refers to a direction perpendicular to the lateral direction in the plane, and a vertical direction refers to a direction perpendicular to the plane;
   the dielectric layers are arranged at intervals in the longitudinal direction in the first type doping body, and the first type doping body is between adjacent dielectric layers in the longitudinal direction; and a polysilicon is partially or completely surrounded by a dielectric layer of the dielectric layers; and
   metals are respectively located on a left side of the second type heavy doping source and a right side of the second type heavy doping drain; the first type heavy doping body contact is located below a left part of the second type heavy doping source, and left sides of both the first type heavy doping body contact and the second type heavy doping source contact a metal of the metals; a bottom of the metal is below a bottom of the first type heavy doping body contact; the right side of the second type heavy doping drain contacts the metal; and the bottom of the metal is below a bottom of the second type heavy doping drain.

18. A lateral power semiconductor device, comprising: a first type doping substrate at a bottom of the lateral power semiconductor device, a second type doping drift region above the first type doping substrate, a second type heavy doping drain located at an upper right of the second type doping drift region, and a first type doping body located at an upper left in the second type doping drift region; wherein
   a first type heavy doping body contact and a second type heavy doping source are provided at an upper left in the first type doping body, and dielectric layers are on a right side of the second type heavy doping source;
   a lateral direction refers to a direction from the first type heavy doping body contact to the second type heavy doping drain in a plane parallel to a surface of the lateral power semiconductor device, a longitudinal direction refers to a direction perpendicular to the lateral direction in the plane, and a vertical direction refers to a direction perpendicular to the plane;
   the dielectric layers are arranged at intervals in the longitudinal direction in the first type doping body, and the first type doping body is between adjacent dielectric layers in the longitudinal direction; and a polysilicon is partially or completely surrounded by a dielectric layer of the dielectric layers; and
   a first type doping surface layer region is partially located over the second type doping drift region, and an upper surface of the first type doping surface layer region is tangent to an upper surface of the second type doping drift region or the upper surface of the first type doping surface layer region does not contact the upper surface of the second type doping drift region; a left boundary of the first type doping surface layer region does not contact a right boundary of the dielectric layer; and a right boundary of the first type doping surface layer region does not contact a left boundary of the second type heavy doping drain.

\* \* \* \* \*